US012408359B2

(12) United States Patent
Matsubara et al.

(10) Patent No.: US 12,408,359 B2
(45) Date of Patent: Sep. 2, 2025

(54) SEMICONDUCTOR ELEMENT AND SEMICONDUCTOR DEVICE

(71) Applicant: FLOSFIA INC., Kyoto (JP)

(72) Inventors: Yusuke Matsubara, Kyoto (JP); Osamu Imafuji, Kyoto (JP); Hiroyuki Ando, Kyoto (JP); Hideki Takehara, Kyoto (JP); Takashi Shinohe, Kyoto (JP); Mitsuru Okigawa, Kyoto (JP)

(73) Assignee: FLOSFIA INC., Kyoto (JP)

( * ) Notice: Subject to any disclaimer, the term of this patent is extended or adjusted under 35 U.S.C. 154(b) by 363 days.

(21) Appl. No.: 17/882,148

(22) Filed: Aug. 5, 2022

(65) Prior Publication Data

US 2022/0384663 A1    Dec. 1, 2022

Related U.S. Application Data

(63) Continuation-in-part of application No. PCT/JP2021/004412, filed on Feb. 5, 2021.

(30) Foreign Application Priority Data

Feb. 7, 2020  (JP) ................................ 2020-019326
Feb. 7, 2020  (JP) ................................ 2020-019328
Feb. 7, 2020  (JP) ................................ 2020-019329

(51) Int. Cl.
*H10D 8/60*   (2025.01)
*H10D 62/80*  (2025.01)
*H10D 30/65*  (2025.01)

(52) U.S. Cl.
CPC ............... *H10D 8/60* (2025.01); *H10D 62/80* (2025.01); *H10D 30/657* (2025.01)

(58) Field of Classification Search
CPC ... H01L 29/24; H01L 29/7824; H01L 29/872; H01L 21/28; H01L 2224/40137;
(Continued)

(56) References Cited

U.S. PATENT DOCUMENTS

2008/0142795 A1  6/2008  Ichinose et al.
2014/0273402 A1  9/2014  Tsai et al.
(Continued)

FOREIGN PATENT DOCUMENTS

CN  102473599  5/2012
CN  106997873  8/2017
(Continued)

OTHER PUBLICATIONS

International Search Report dated May 11, 2021 in International (PCT) Application No. PCT/JP2021/004412.
(Continued)

*Primary Examiner* — Monica D Harrison
(74) *Attorney, Agent, or Firm* — Wenderoth, Lind & Ponack, L.L.P.

(57) ABSTRACT

Provided is a semiconductor element including: a multilayer structure including: a conductive substrate; and an oxide semiconductor film arranged directly on the conductive substrate or over the conductive substrate via a different layer, the oxide semiconductor film including an oxide, as a major component, having a corundum structure, the conductive substrate having a larger area than the oxide semiconductor film.

15 Claims, 14 Drawing Sheets

(58) Field of Classification Search
CPC . H01L 2224/48247; H01L 2224/73221; H01L 23/12; H01L 23/36; H01L 23/473; H01L 23/49562; H01L 23/49568; H01L 23/49575; H10D 8/60; H10D 30/657; H10D 62/80
USPC .......................................................... 257/43
See application file for complete search history.

(56) References Cited

U.S. PATENT DOCUMENTS

| | | | |
|---|---|---|---|
| 2017/0179249 A1* | 6/2017 | Oda .................. | H01L 21/02565 |
| 2020/0211919 A1* | 7/2020 | Takahashi ......... | H01L 21/02628 |
| 2020/0266304 A1 | 8/2020 | Ueoka et al. | |

FOREIGN PATENT DOCUMENTS

| | | |
|---|---|---|
| CN | 113113482 | 7/2021 |
| JP | 2005-260101 | 9/2005 |
| JP | 2008-300627 | 12/2008 |
| JP | 2009-81468 | 4/2009 |
| JP | 2013-012760 | 1/2013 |
| JP | 2014-183310 | 9/2014 |
| JP | 2016-82232 | 5/2016 |
| JP | 2017-118014 | 6/2017 |
| JP | 2018-60992 | 4/2018 |
| TW | 200846511 | 12/2008 |
| WO | 2017/111174 | 6/2017 |

OTHER PUBLICATIONS

Jun Liang Zhao et al., "UV and Visible Electroluminescence From a Sn: $Ga_2O_3/n^+$—Si Heterojunction by Metal-Organic Chemical Vapor Deposition", IEEE Transactions on Electron Devices, vol. 58, No. 5, May 2011, pp. 1447-1451.
Kohei Sasaki et al., "Si-Ion Implantation Doping in $\beta$-$Ga_2O_3$ and Its Application to Fabrication of Low-Resistance Ohmic Contacts", Applied Physics Express 6 (2013) 086502, pp. 086502-1-086502-4.
Office Action issued Mar. 24, 2025 in corresponding Taiwanese Patent Application No. 110104487, with English translation.
First Office Action issued May 24, 2025 in corresponding Chinese Patent Application No. 202180013128.X, with English translation.

* cited by examiner (a)                                   (b)

FIG. 15
(a) 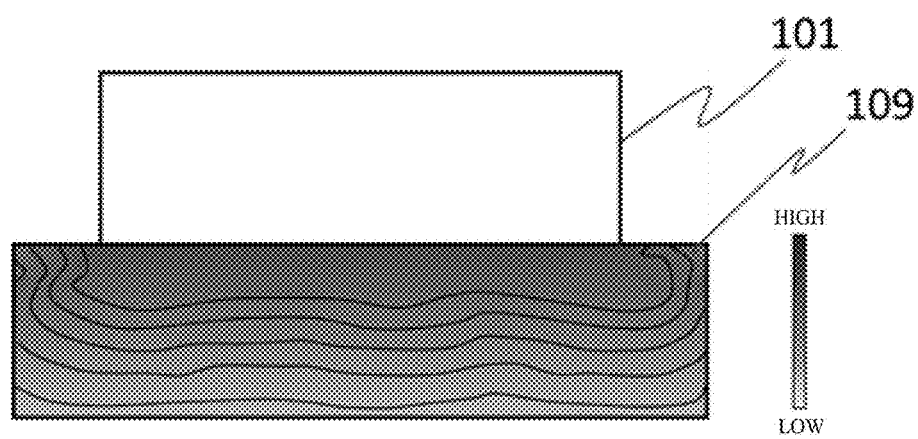
(b) 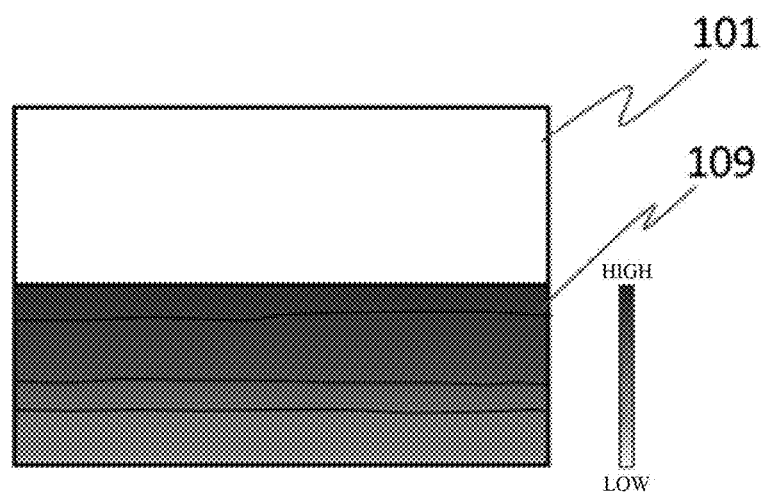

FIG. 16
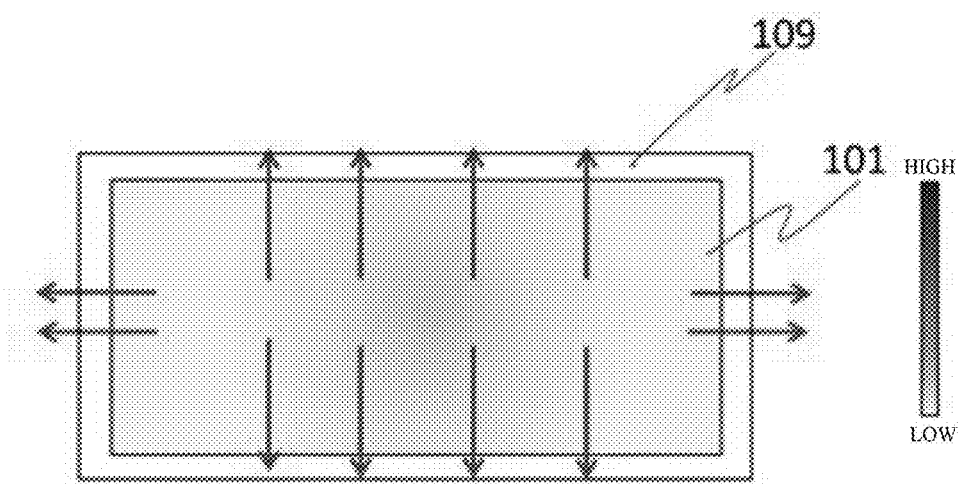
(a)
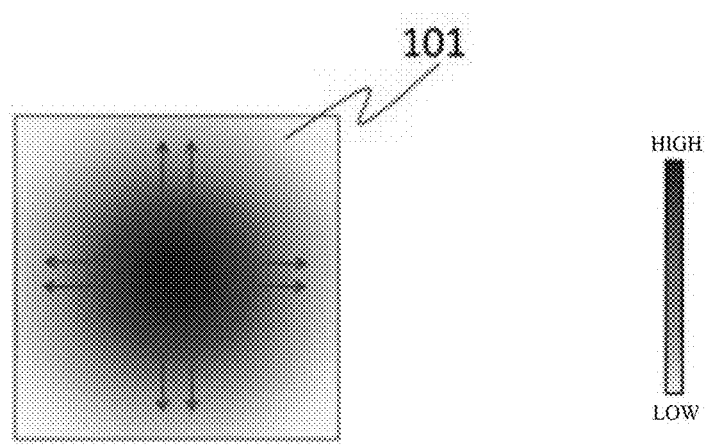
(b)

SEMICONDUCTOR ELEMENT AND SEMICONDUCTOR DEVICE

CROSS REFERENCE TO RELATED APPLICATION

This application is a continuation-in-part application of International Patent Application No. PCT/JP2021/004412 (Filed on Feb. 5, 2021), which claims the benefit of priority from Japanese Patent Application No. 2020-019326 (filed on Feb. 7, 2020), No. 2020-019328 (filed on Feb. 7, 2020), and No. 2020-019329 (filed on Feb. 7, 2020).

The entire contents of the above applications, which the present application is based on, are incorporated herein by reference.

1. FIELD OF THE INVENTION

The disclosure relates to a semiconductor element useful, for example, for power devices, and a semiconductor device and a semiconductor system each using the semiconductor element.

2. DESCRIPTION OF THE RELATED ART

Gallium oxide ($Ga_2O_3$) is transparent semiconductor having a wide band gap from 4.8 to 5.3 eV at room temperature and to absorb very little visible light and ultraviolet light. For this reason, gallium oxide is a promising material for use particularly in opto-electronic devices to operate in a deep ultraviolet light region or in transparent electronics. In recent years, developments are under way on photodetectors, light-emitting diodes (LEDs), and transistors based on gallium oxide ($Ga_2O_3$).

Gallium oxide ($Ga_2O_3$) has five crystal structures of $\alpha$, $\beta$, $\gamma$, $\sigma$, and $\varepsilon$, and generally has $\beta$-$Ga_2O_3$ as the most stable structure. Meanwhile, $\beta$-$Ga_2O_3$ is a $\beta$-Gallia structure. Hence, unlike a crystal system generally used in electronic materials, etc., application to semiconductor elements is not always preferred. Furthermore, as growth of a $\beta$-$Ga_2O_3$ thin film requires a high substrate temperature and a high degree of vacuum, a problem of increased manufacturing cost is also caused. Moreover, in the case of $\beta$-$Ga_2O_3$, even a dopant (Si) of a high concentration (equal to or greater than $1\times10^{19}/cm^3$, for example) is still prohibited from being used as a donor unless annealing process is performed at a high temperature from 800 to 1100° C. after ion implantation.

On the other hand, as $\alpha$-$Ga_2O_3$ has the same crystal structure as a sapphire substrate already used for general purpose, it is used preferably in opto-electronic devices. Moreover, as $\alpha$-$Ga_2O_3$ has a wider band gap than $\beta$-$Ga_2O_3$, it is useful, particularly for power devices. Thus, a semiconductor element using $\alpha$-$Ga_2O_3$ as semiconductor is being desired.

A semiconductor element known as an electrode using $\beta$-$Ga_2O_3$ as semiconductor and capable of obtaining Ohmic characteristics conforming to this semiconductor uses two layers composed of a Ti layer and an Au layer, three layers composed of a Ti layer, an Al layer, and an Au layer, or four layers composed of a Ti layer, an Al layer, an Ni layer, and an Au layer.

A semiconductor element known as an electrode using $\beta$-$Ga_2O_3$ as semiconductor and capable of obtaining Schottky characteristics conforming to this semiconductor uses either a multilayer structure of Au and Pt or a multilayer structure of Ni and Au.

However, employing such an electrode to a semiconductor element using $\alpha$-$Ga_2O_3$ as semiconductor causes a problem that the electrode fails to function as a Schottky electrode or an Ohmic electrode, a joint of the electrode to a film is not obtained, or semiconductor characteristics are damaged. Moreover, such an electrode structure has failed to obtain a satisfactory semiconductor element in a practical sense for the reason of causing a leakage current from an electrode terminal.

In particular, in recent years, using gallium oxide as semiconductor causes a problem relating to heat dissipation performance to cause a problem such as adverse influence on semiconductor characteristics. In response to such a problem, the present applicant examined forming a semiconductor element by bonding a conductive substrate to a semiconductor film made of gallium oxide. However, it was difficult to form a satisfactory semiconductor element due to the occurrence of a crack or impurity occurring or the occurrence of a burr in gallium oxide.

SUMMARY OF THE INVENTION

According to an example of the present disclosure, there is provided a semiconductor element including: a multilayer structure including: a conductive substrate; and an oxide semiconductor film arranged directly on the conductive substrate or over the conductive substrate via a different layer, the oxide semiconductor film including an oxide, as a major component, having a corundum structure, the conductive substrate having a larger area than the oxide semiconductor film.

According to an example of the present disclosure, there is provided a semiconductor element including: a multilayer structure including: an electrode; and an oxide semiconductor film arranged directly on the electrode or over the electrode via a different layer, as a major component, the oxide semiconductor film including an oxide having a corundum structure, the electrode having a larger area than the oxide semiconductor film.

Thus, a semiconductor element of the disclosure is excellent in semiconductor characteristics and heat dissipation performance.

BRIEF DESCRIPTION OF THE DRAWINGS

FIG. 15 is a view illustrating evaluation result about simulation of a heat distribution according to an example.

FIG. 16 is a view illustrating evaluation result about simulation of a heat distribution according to an example. In the drawing, arrows indicate directions of heat transfer.

DETAILED DESCRIPTION

Figure 1:
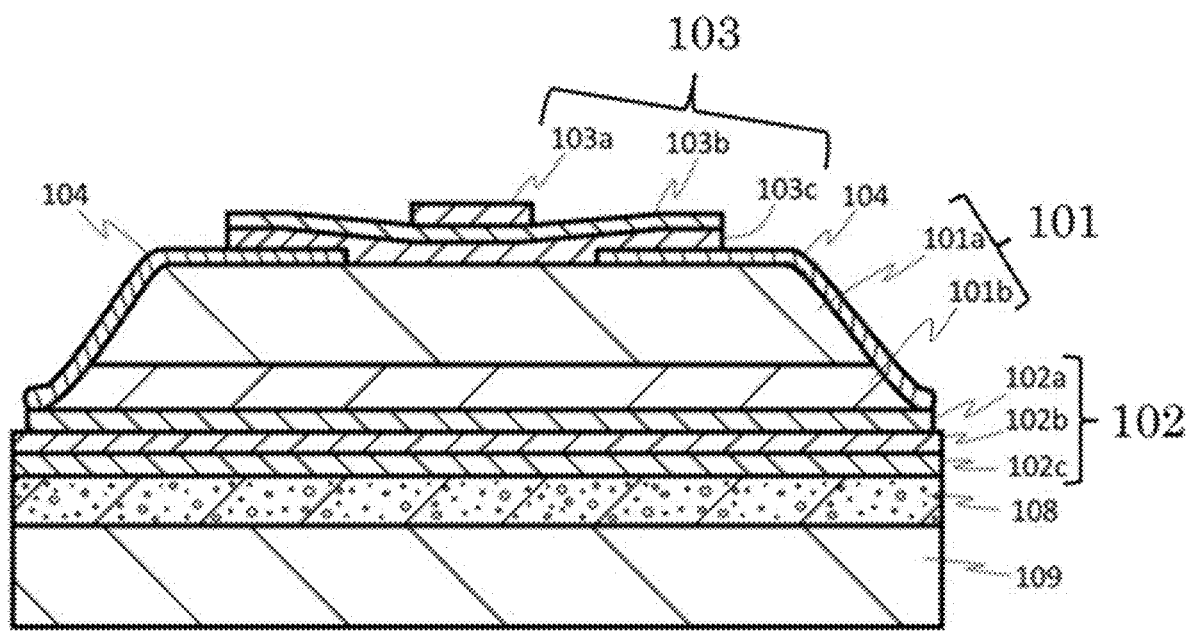
FIG. 1 is a sectional view schematically illustrating a preferred embodiment of a semiconductor element of the disclosure.

The inventors of the present disclosure have succeeded in forming a semiconductor element including an oxide semiconductor film that overcomes a problem such as a burr to provide favorable semiconductor characteristics and has excellent heat dissipation performance by bonding a conductive substrate a size larger than the oxide semiconductor film and cutting from the side of the conductive substrate. The inventors of the present disclosure have found that such a semiconductor element is capable of solving all the above-described conventional problems.

Embodiments of the present disclosure will be described below with reference to the accompanying drawings. In the following description, the same parts and components are designated by the same reference numerals. The present embodiment includes, for example, the following disclosures.

[Structure 1]
A semiconductor element including: a multilayer structure including: a conductive substrate; and an oxide semiconductor film arranged directly on the conductive substrate or over the conductive substrate via a different layer, the oxide semiconductor film including an oxide, as a major component, having a corundum structure, the conductive substrate having a larger area than the oxide semiconductor film.

[Structure 2]
A semiconductor element including: a multilayer structure including: an electrode; and an oxide semiconductor film arranged directly on the electrode or over the electrode via a different layer, the oxide semiconductor film including an oxide, as a major component, having a corundum structure, the electrode having a larger area than the oxide semiconductor film.

[Structure 3]
The semiconductor element according to [Structure 1] or [Structure 2], wherein the oxide contains at least gallium.

[Structure 4]
The semiconductor element according to [Structure 1] or [Structure 2], wherein the oxide is $\alpha\text{-Ga}_2\text{O}_3$ or a mixed crystal of $\alpha\text{-Ga}_2\text{O}_3$.

[Structure 5]
The semiconductor element according to [Structure 1], wherein the conductive substrate has a linear thermal expansion coefficient that is equal to or less than a linear thermal expansion coefficient of the oxide semiconductor film.

[Structure 6]
The semiconductor element according to [Structure 1], wherein the oxide semiconductor film includes at least a first side, a second side, a first crystal axis, and a second crystal axis, a linear thermal expansion coefficient in a direction of the first crystal axis is less than a linear thermal expansion coefficient in a direction of the second crystal axis, a direction of the first side is parallel or substantially parallel to the direction of the first crystal axis, a direction of the second side is parallel or substantially parallel to the direction of the second crystal axis, the conductive substrate includes at least a side corresponding to the first side and a side corresponding to the second side, and the side corresponding to the first side is longer than the side corresponding to the second side.

[Structure 7]
The semiconductor element according to [Structure 1], wherein the conductive substrate is a metal substrate or a semiconductor substrate.

[Structure 8]
The semiconductor element according to [Structure 1], wherein the conductive substrate has a size larger area than an area of the oxide semiconductor film.

[Structure 9]
The semiconductor element according to [Structure 2], wherein the electrode has a size larger area than an area of the oxide semiconductor film.

[Structure 10]
The semiconductor element according to [Structure 1], wherein the conductive substrate has an area that is 1.1 to 4 times an area of the oxide semiconductor film.

[Structure 11]
The semiconductor element according to [Structure 2], wherein the electrode has an area that is 1.1 to 4 times an area of the oxide semiconductor film.

[Structure 12]
The semiconductor element according to [Structure 1], wherein the conductive substrate has a side surface as a cut surface and the cut surface has a step or a burr.

[Structure 13]
The semiconductor element according to [Structure 1] or [Structure 2], wherein the semiconductor element is a vertical device.

[Structure 14]
The semiconductor element according to [Structure 1] or [Structure 2], wherein the semiconductor element is a power device.

[Structure 15]
The semiconductor element according to [Structure 1] or [Structure 2], wherein the semiconductor element is a Schottky barrier diode (SBD), a metal oxide semiconductor field-effect transistor (MOSFET), or an insulated gate bipolar transistor (IGBT).

[Structure 16]
A semiconductor device configured by joining at least a semiconductor element with a joint member to a lead frame, a circuit board, or a heat dissipation substrate, the semiconductor element being the semiconductor element according to any one of [Structure 1] to [Structure 15].

[Structure 17]

The semiconductor device according to [Structure 16], wherein the semiconductor device is a power module, an inverter, or a converter.

[Structure 18]

The semiconductor device according to [Structure 16], wherein the semiconductor device is a power card.

[Structure 19]

A semiconductor system including a semiconductor element or a semiconductor device, the semiconductor element being the semiconductor element according to any one of [Structure 1] to [Structure 15], the semiconductor device being the semiconductor device according to any one of [Structure 16] to [Structure 18].

A semiconductor element of the disclosure is a semiconductor element including a multilayer structure including: a conductive substrate; and an oxide semiconductor film arranged directly on the conductive substrate or over the conductive substrate via a different layer, the oxide semiconductor film including an oxide, as a major component, having a corundum structure, characterized in that the conductive substrate has a larger area than the oxide semiconductor film. An example of the multilayer structure is a stacked structure. Here, "conductive" means electrically conductive. Also, the term "has a larger area" herein means that, in a plan view, an area of the conductive substrate is larger than an area of the oxide semiconductor film.

A semiconductor element of the disclosure is a semiconductor element including: a multilayer structure including: an electrode; and an oxide semiconductor film arranged directly on the electrode or over the electrode via a different layer, the oxide semiconductor film including an oxide, as a major component, having a corundum structure, characterized in that the electrode has a larger area than the oxide semiconductor film. The term "has a larger area" herein means that, in a plan view, an area of the electrode is larger than an area of the oxide semiconductor film.

According to the disclosure, it is preferable that the conductive substrate has a linear thermal expansion coefficient that is equal to or less than the linear thermal expansion coefficient of the oxide semiconductor film. According to the disclosure, it is preferable that the oxide semiconductor film includes at least a first side, a second side, a first crystal axis, and a second crystal axis, a linear thermal expansion coefficient in a direction of the first crystal axis is less than a linear thermal expansion coefficient in a direction of the second crystal axis, a direction of the first side is parallel or substantially parallel to the direction of the first crystal axis, a direction of the second side is parallel or substantially parallel to the direction of the second crystal axis, the conductive substrate includes at least a side corresponding to the first side and a side corresponding to the second side, and the side corresponding to the first side is longer than the side corresponding to the second side as they fulfill more excellent heat dissipation performance of the semiconductor element. The term "crystal axis" means a coordinate axis derived from a crystal structure for systematically indicating a crystal plane, symmetry of rotation, etc. Furthermore, the term "first side" may be a straight line or a curved line. According to the disclosure, the first side is preferably a straight line for providing more excellent relationship with a crystal axis. Also, the term "second side" may be a straight line or a curved line. According to the disclosure, the second side is preferably a straight line for providing more excellent relationship with a crystal axis. The term "linear thermal expansion coefficient" is measured according to JIS R 3102 (1995). The term "direction of the side" means a direction of a side constituting a specific shape. The phrase "being substantially parallel" does not require being parallel completely but permits a configuration slightly shifted from being parallel completely (for example, in one configuration, an angle between corresponding elements may be greater than 0° and equal to or less than 10°).

According to the disclosure, it is preferable that the conductive substrate is a size larger than the oxide semiconductor film as it allows size reduction of the semiconductor element easily while providing excellent heat dissipation performance of the semiconductor element. The phrase "being a size larger" means that the conductive substrate has an area that is 1.1 to 4 times the area of the oxide semiconductor film, for example. According to the disclosure, it is also preferable that the conductive substrate has a side surface as a cut surface and the cut surface has a step or a burr.

The oxide semiconductor film (hereinafter also called a "semiconductor layer" or a "semiconductor film" simply) is not particularly limited as long as it has a corundum structure. According to the disclosure, the oxide preferably contains one or two or more types of metal selected from Group 9 (cobalt, rhodium, or iridium, for example) and Group 13 (aluminum, gallium, or indium, for example) of the periodic table, more preferably, contains at least one type of metal selected from aluminum, indium, gallium, and iridium, still more preferably, contains at least gallium or iridium, most preferably, contains at least gallium. According to the disclosure, it is preferable that the oxide semiconductor film has an m-plane as a principal plane as it makes it possible to restrict diffusion of oxygen, etc. further and to fulfill more excellent electric characteristics. The oxide semiconductor layer may have an off-angle. According to the disclosure, the oxide is preferably $\alpha\text{-}Ga_2O_3$ or a mixed crystal of $\alpha\text{-}Ga_2O_3$. The term "major component" means that the oxide has a content in terms of an atomic ratio of equal to or greater than 50% preferably to all components in the semiconductor layer, means that the content is more preferably equal to or greater than 70%, still more preferably, equal to or greater than 90%, and means the content may be 100%. The thickness of the semiconductor layer is not particularly limited but may be equal to or less than 1 μm or equal to or greater than 1 μm. According to the disclosure, this thickness is preferably equal to or greater than 1 μm, more preferably, equal to or greater than 10 μm. While the surface area of the semiconductor film is not particularly limited, it may be equal to or greater than 1 $mm^2$ or equal to or less than 1 $mm^2$. This surface area is preferably from 10 $mm^2$ to 300 $cm^2$, more preferably, from 100 $mm^2$ to 100 $cm^2$. While the semiconductor film is preferably a single-crystal film, it may be a poly-crystal film or a crystal film containing poly crystal. The semiconductor film is a multi-layer film including at least a first semiconductor layer and a second semiconductor layer. If a Schottky electrode is provided on the first semiconductor layer, the multilayer film is preferably a film where carrier density in the first semiconductor layer is less than carrier density in the second semiconductor layer. In this case, the second semiconductor layer generally contains a dopant and carrier density in the semiconductor layer is appropriately settable through adjustment of a doping amount.

Preferably, the oxide semiconductor is a metal oxide. While the metal oxide is not particularly limited, it preferably includes one or two or more types of metal at least from the fourth period to the sixth period of the periodic table. The metal oxide more preferably includes at least gallium, indium, rhodium, or iridium, and most preferably, includes gallium. According to the disclosure, the metal oxide preferably includes gallium and indium or/and aluminum.

The semiconductor layer preferably contains a dopant. The dopant is not particularly limited but may be publicly-known. Examples of the dopant include n-type dopants such as tin, germanium, silicon, titanium, zirconium, vanadium, and niobium, and p-type dopants such as magnesium, calcium, and zinc. According to the disclosure, the semiconductor layer preferably contains an n-type dopant, more preferably, is an n-type oxide semiconductor layer. Furthermore, according to the disclosure, the n-type dopant is preferably Sn, Ge, or Si. The content of the dopant is preferably equal to or greater than 0.00001 atomic % in the composition of the semiconductor layer, more preferably, from 0.00001 to 20 atomic %, most preferably, from 0.00001 to 10 atomic %. More specifically, the concentration of the dopant may generally be from about $1 \times 10^{16}$ to about $1 \times 10^{22}/cm^3$. The concentration of the dopant may be set to a low concentration of equal to or less than about $1 \times 10^{17}/cm^3$, for example. According to an embodiment of the disclosure, the dopant may be contained at a high concentration of equal to or greater than about $1 \times 10^{20}/cm^3$. The concentration of fixed charge in the semiconductor layer is also free from particular limitation. According to the disclosure, this concentration is preferably equal to or less than $1 \times 10^{17}/cm^3$ as it allows a depletion layer to be formed favorably using the semiconductor layer.

The semiconductor layer may be formed using publicly-known means. Examples of the means of forming the semiconductor layer include CVD method, MOCVD method, MOVPE method, mist CVD method, mist epitaxy method, MBE method, HVPE method, pulse growth method, and ALD method. According to the disclosure, the means of forming the semiconductor layer is preferably mist CVD method or mist epitaxy method. The mist CVD method or the mist epitaxy method is conducted, for example, by atomizing a raw material solution (atomization step), causing droplets to float, carrying resultant atomized droplets onto a base with a carrier gas after the atomization (carrying step), and then causing a thermal reaction of the atomized droplets in the vicinity of the base to provide a semiconductor film containing an oxide as a major component on the base (deposition step) to form the semiconductor layer.

(Atomization Step)

At the atomization step, the raw material solution is atomized. Means of atomizing the raw material solution is not particularly limited but may be publicly-known means as long as it is available for atomization of the raw material solution. According to the disclosure, atomization means using ultrasonic waves is preferred. The atomized droplets obtained by using ultrasonic waves are preferred as they have a zero initial velocity and are to float in the air. These atomized droplets are free from damage due to collision energy so considerably preferred as they are atomized droplets (including mist) to float in the space and carriable as a gas, not to be blown like a spray. The droplet size is not particularly limited and the atomized droplets may be droplets of several millimeters. Preferably, the droplet size is equal to or less than 50 μm, more preferably, from 100 nm to 10 μm.

(Raw Material Solution)

The raw material solution is not particularly limited as long as it contains a raw material available for atomization and available for forming a semiconductor film. The raw material may be an inorganic material or an organic material. According to the disclosure, the raw material is preferably metal or a metal compound, more preferably, includes one or two or more types of metal selected from aluminum, gallium, indium, iron, chromium, vanadium, titanium, rhodium, nickel, cobalt, and iridium.

According to the disclosure, a solution containing the metal, in a form of complex or salt, dissolved or dispersed in an organic solvent or water may be used preferably as the raw material solution. Examples of the form of the complex include an acetylacetonate complex, a carbonyl complex, an ammine complex, and a hydride complex. Examples of the form of the salt include an organic metal salt (e.g., metal acetate, metal oxalate, metal citrate, etc.), metal sulfide, metal nitrate, phosphorylated metal, and metal halide (e.g., metal chloride, metal bromide, metal iodide, etc.).

Preferably, the raw material solution contains a mixed additive such as a hydrohalic acid or an oxidant. Examples of the hydrohalic acid include hydrobromic acid, hydrochloric acid, and hydroiodic acid. In particular, hydrobromic acid or hydroiodic acid is preferred for reason of being capable of reducing the occurrence of an abnormal particle more effectively. Examples of the oxidant include peroxide such as hydrogen peroxide ($H_2O_2$), sodium peroxide ($Na_2O_2$), barium peroxide ($BaO_2$), and benzoyl peroxide ($(C_6H_5CO)_2O_2$), hypochlorous acid (HClO), perchloric acid, nitric acid, ozone water, and an organic peroxide such as peracetic acid and nitrobenzene.

The raw material solution may contain a dopant. Incorporating the dopant into the raw material solution makes it possible to perform doping favorably. The dopant is not particularly limited unless it interferes with the present disclosure. Examples of the dopant include n-type dopants such as tin, germanium, silicon, titanium, zirconium, vanadium and niobium, and p-type dopants such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, N, and P. The content of the dopant is set appropriately using a calibration curve indicating a relationship of the concentration of the dopant in the raw material with intended carrier density.

A solvent of the raw material solution is not particularly limited but may be an inorganic solvent such as water, an organic solvent such as alcohol, or a mixed solvent of the inorganic solvent and the organic solvent. According to the disclosure, the solvent preferably includes water, more preferably, is water or a mixed solvent of water and alcohol.

(Carrying Step)

At the carrying step, the atomized droplets are carried into a deposition chamber by using a carrier gas. The carrier gas is not particularly limited unless it interferes with the disclosure. Preferred examples of the carrier gas include oxygen, ozone, an inert gas such as nitrogen or argon, and a reduction gas such as hydrogen gas or forming gas. Furthermore, the carrier gas may have one type, or two or more types. Moreover, a diluted gas (e.g., 10-fold diluted gas) and the like reduced in flow rate may be further used as a second carrier gas. A location for supplying the carrier gas is not limited to one but the carrier gas may be supplied from two or more locations. While the flow rate of the carrier gas is not particularly limited, it is preferably from 0.01 to 20 L/min, more preferably, from 1 to 10 L/min. In the case of a diluted gas, the flow rate of the diluted gas is preferably from 0.001 to 2 L/min, more preferably, from 0.1 to 1 L/min.

(Deposition Step)

At the deposition step, a thermal reaction of the atomized droplets is caused in the vicinity of the base to deposit the semiconductor film on the base. The thermal reaction is simply required to be a reaction of the atomized droplets using heat. Conditions, etc. for the reaction are not particularly limited unless they interfere with the present disclosure. At this step, the thermal reaction is generally made at a temperature equal to or higher than an evaporation temperature of a solvent. Preferably, this temperature does not exceed an excessively high temperature (1000° C., for example) and more preferably, it is equal to or less than 650° C., most preferably, from 300 to 650° C. The thermal reaction may be made in any of atmospheres including vacuum, non-oxygen atmosphere (such as inert gas atmosphere, for example), reducing gas atmosphere, and oxygen atmosphere unless they interfere with the present disclosure. Preferably, the thermal reaction is made under inert gas atmosphere or oxygen atmosphere. Furthermore, the thermal reaction may be made under any of conditions including atmospheric pressure, increased pressure, and reduced pressure. According to the disclosure, the thermal reaction is preferably made under atmospheric pressure. The thickness of the semiconductor film is settable through adjustment of a time of the deposition.

(Base)

The base is not particularly limited as long as it is available for supporting the semiconductor film. A material of the base is also free from particular limitation and the base may be a publicly-known base unless it interferes with the present disclosure. The material may be an organic compound or an inorganic compound. Any shape is applicable as the shape of the base. The base is effective for every type of shape. Examples of the shape include plate-like shapes such as flat plates or circular plates, fibrous shapes, rod shapes, circular columnar shape, prism shapes, tubular shapes, spiral shapes, spherical shapes, and ring shapes. According to the disclosure, a substrate is preferred. According to the disclosure, the thickness of the substrate is not particularly limited.

The substrate is not particularly limited as long as it has a plate-like shape and functions as a support for the semiconductor film. While the substrate may be an insulator substrate, a semiconductor substrate, a metal substrate, or a conductive substrate, the substrate is preferably an insulator substrate or is also preferably a substrate with a metal film formed on its surface. Examples of the substrate include a base substrate containing a substrate material having a corundum structure as a major component, a base substrate containing a substrate material having a β-Gallia structure as a major component, and a base substrate including a substrate material having a hexagonal crystal structure as a major component. The term "major component" herein means that the substrate material having the above-described specific crystal structure has a content in terms of an atomic ratio of equal to or greater than 50% preferably to all components in the substrate material, means that the content is more preferably equal to or greater than 70%, still more preferably, equal to or greater than 90%, and may be 100%.

The substrate material is not particularly limited but may be a publicly-known material unless it interferes with the present disclosure. Preferred examples of the above-described substrate material having a corundum structure include an $\alpha$-$Al_2O_3$ (sapphire substrate) or $\alpha$-$Ga_2O_3$. More preferred examples thereof include an a-plane sapphire substrate, an m-plane sapphire substrate, an r-plane sapphire substrate, a c-plane sapphire substrate, and an $\alpha$-type gallium oxide substrate (a-plane, m-plane, or r-plane). Examples of the base substrate containing the substrate material having a β-Gallia structure as a major component include β-$Ga_2O_3$ substrate and a mixed crystal substrate containing $Ga_2O_3$ and $Al_2O_3$ in which $Al_2O_3$ is greater than 0 wt % and equal to or less than 60 wt %. Examples of the base substrate containing the substrate material having a hexagonal crystal structure as a major component include an SiC substrate, a ZnO substrate, and a GaN substrate.

According to the disclosure, annealing process may be performed after the deposition step. A processing temperature of the annealing is not particularly limited unless it interferes with the present disclosure. This temperature is generally from 300 to 650° C., preferably, from 350 to 550° C. A processing time of the annealing is generally from 1 minute to 48 hours, preferably, from 10 minutes to 24 hours, more preferably, from 30 minutes to 12 hours. The annealing process may be performed in any atmosphere unless it interferes with the present disclosure. The annealing process may be performed under non-oxygen atmosphere or oxygen atmosphere. Examples of the non-oxygen atmosphere include inert gas atmosphere (for example, nitrogen atmosphere) and reducing gas atmosphere. According to the disclosure, inert gas atmosphere is preferred and nitrogen atmosphere is more preferred.

According to the disclosure, the semiconductor film may be provided directly on the base. Alternatively, the semiconductor film may be provided across a different layer such as a stress relaxing layer (such as a buffer layer or an ELO layer, for example) or a separation sacrificial layer over the base. Means of forming each layer is not particularly limited but may be publicly-known means. According to the disclosure, mist CVD method is preferred.

According to the disclosure, the semiconductor film may be subjected to publicly-known means such as being bonded to the conductive substrate having a larger surface area than the semiconductor film and then being separated from the base, etc., and then may be used as the semiconductor layer in a semiconductor element. Alternatively, the semiconductor film may be used as it is as the semiconductor layer in a semiconductor element in which the semiconductor film and the conductive substrate having a larger surface area than the semiconductor film are thermally coupled to each other.

According to the disclosure, a multilayer structure including the electrode and the semiconductor film arranged directly on the electrode or over the electrode across a different layer may be subjected to publicly-known means of being bonded to the conductive substrate having a larger surface area than the semiconductor film and then being separated from the base, etc., and then may be used as the multilayer structure in a semiconductor element. Alternatively, the multilayer structure may be used as it is in a semiconductor element in which the semiconductor film and the electrode are thermally coupled to the conductive substrate having a larger surface area than the semiconductor film.

A constituent material of the electrode is not particularly limited as long as it has conductive property and is available as an electrode unless it interferes with the present disclosure. The constituent material of the electrode may be a conductive inorganic material or a conductive organic material. According to the disclosure, the material of the electrode is preferably metal. Preferably, the metal is at least one type of metal selected from Group 4 to Group 11 of the periodic table, for example. Examples of metal in Group 4 of the periodic table include titanium (Ti), zirconium (Zr), and hafnium (Hf). Examples of metal in Group 5 of the periodic table include vanadium (V), niobium (Nb), and tantalum (Ta). Examples of metal in Group 6 of the periodic table include chromium (Cr), molybdenum (Mo), and tungsten (W). Examples of metal in Group 7 of the periodic table include manganese (Mn), technetium (Tc), and rhenium (Re). Examples of metal in Group 8 of the periodic table include iron (Fe), ruthenium (Ru), and osmium (Os). Examples of metal in Group 9 of the periodic table include cobalt (Co), rhodium (Rh), and iridium (Ir). Examples of metal in Group 10 of the periodic table include nickel (Ni), palladium (Pd), and platinum (Pt). Examples of metal in Group 11 of the periodic table include copper (Cu), silver (Ag), and gold (Au). While the thickness of the electrode is not particularly limited, it is preferably from 0.1 nm to 10 μm, more preferably, from 5 to 500 nm, most preferably, from 10 to 200 nm. While the electrode may be a Schottky electrode or an Ohmic electrode, it is preferably an Ohmic electrode according to the disclosure.

According to the disclosure, it is preferable that each of the oxide semiconductor film and the electrode is arranged over the conductive substrate across a porous layer. According to the disclosure, it is preferable that the porous layer has a porosity of equal to or less than 10%. The term "porosity" herein means the ratio of the volume of space generated by voids to the volume of the porous layer (volume including the voids). The porosity of the porous layer may be determined on the basis of a photograph of a section captured using a scanning electron microscope (SEM), for example. More specifically, photographs of sections (SEM images) of the porous layer are captured at a plurality of positions. Next, using commercially-available image analysis software, the captured SEM images are subjected to binarization to determine the ratios of portions (for example, black portions) corresponding to holes (voids) in the SEM images. An average of the ratios of the black portions determined from the SEM images captured at the plurality of positions is obtained and defined as the porosity of the porous layer. The above-described term "porous layer" includes not only a porous film shape as a structure of a continuous film but also includes a porous aggregate shape.

While the porous layer is not particularly limited, it preferably contains metal. The porous layer more preferably contains precious metal such as gold (Au), silver (Ag), platinum (Pt), palladium (Pd), rhodium (Rh), iridium (Ir), or ruthenium (Ru), for example, most preferably contains silver (Ag). According to the disclosure, while the porous layer may be such that a porous substrate is covered with a metal film made of the above-described precious metal, it is preferably a porous layer made of the metal, more preferably, is a porous layer made of the precious metal, most preferably, is a porous layer made of silver (Ag). The porous layer may include a single layer or multiple layers. While the thickness of the porous layer is not particularly limited unless it interferes with the present disclosure, it is preferably from about 10 nm to about 1 mm, from 10 nm to 20 μm preferably, more preferably, from 30 nm to 50 μm.

Figure 7:
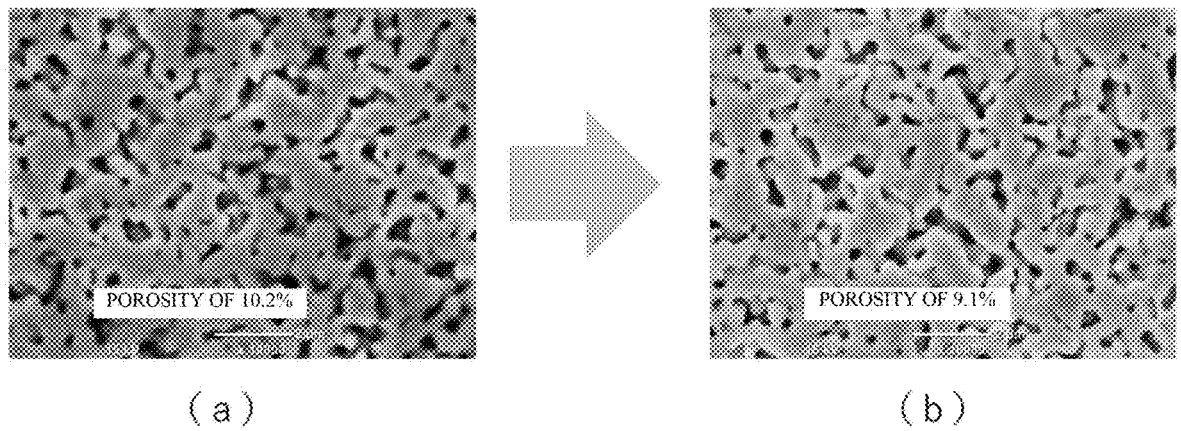
FIG. 7 is a view illustrating a sectional SEM image as a result of a test example, and includes (a) illustrating a case where a porous layer made of silver is formed by normal annealing and (b) illustrating a porous layer with a porosity set equal to or less than 10% by performing further thermocompression bonding.

The porous layer may be obtained more preferably by sintering metal (preferably, precious metal). Means of setting the porosity of the porous layer to equal to or less than 10% is not particularly limited but may be publicly-known means. Appropriately setting conditions for the sintering such as a sintering time, a pressure, and a sintering temperature allows the porosity of the porous layer to be easily set to equal to or less than 10%. According to exemplary means, the porosity is adjusted equal to or less than 10% by pressure bonding under application of heat (thermocompression bonding). As a more specific example, means of performing sintering for a longer sintering time than usual under application of a constant pressure is applicable during the sintering. FIG. 7(a) indicates a porosity as a test example determined when a porous layer made of Ag is bonded by general annealing. As illustrated in FIG. 7(a), the porosity of the porous layer generally exceeds 10%. As illustrated in FIG. 7(b), as a result of a pressure bonding performed further for one hour under application of heat from 300 to 500° C., for example, and under application of a pressure from 0.2 to 10 MPa, for example, the porosity becomes equal to or less than 10%. Using such a porous layer having a porosity of equal to or less than 10% in a semiconductor layer makes it possible to relieve warpage, concentration of thermal stress, etc. without causing damage on semiconductor characteristics.

The conductive substrate is not particularly limited as long as it has conductive property and is available for supporting a semiconductor layer. A material of the conductive substrate is also free from particular limitation unless it interferes with the present disclosure. Examples of the material of the conductive substrate include metal (for example, aluminum, nickel, chromium, nichrome, copper, gold, silver, platinum, rhodium, indium, molybdenum, or tungsten), conductive metal oxide (such as ITO (InSnO compound), FTO (tin oxide doped with fluorine, etc.), or zinc oxide, for example), conductive carbon, and semiconductor (such as SiC, GaN, Si, or diamond). According to the disclosure, the conductive substrate is preferably a metal substrate or a semiconductor substrate, more preferably, a metal substrate. If the conductive substrate is a semiconductor substrate, the conductive substrate is preferably an SiC substrate. If the conductive substrate is a metal substrate, the conductive substrate preferably includes transition metal, more preferably, includes at least one type of metal selected from Group 6 and Group 11 of the periodic table, preferably, includes metal in Group 6 of the periodic table. Examples of the metal in Group 6 of the periodic table include at least one or more types of metal selected from chromium (Cr), molybdenum (Mo), and tungsten (W). According to the disclosure, the metal in Group 6 of the periodic table preferably includes molybdenum. Examples of the metal in Group 11 of the periodic table include at least one type of metal selected from copper (Cu), silver (Ag), and gold (Au). According to the disclosure, it is also preferable that the conductive substrate includes two or more types of metal. Examples of a combination of such two types of metal include copper (Cu)-silver (Ag), copper (Cu)-tin (Sn), copper (Cu)-iron (Fe), copper (Cu)-tungsten (W), copper (Cu)-molybdenum (Mo), copper (Cu)-titanium (Ti), molybdenum (Mo)-lanthanum (La), molybdenum (Mo)-yttrium (Y), molybdenum (Mo)-rhenium (Re), molybdenum (Mo)-tungsten (W), molybdenum (Mo)-niobium (Nb), and molybdenum (Mo)-tantalum (Ta). According to the disclosure, the conductive substrate preferably includes molybdenum as a major component, more preferably, includes molybdenum and copper. The term "major component" herein means that, if the conductive substrate includes Mo as a major component, Mo has a content in terms of an atomic ratio of equal to or greater than 50% preferably to all components in the conductive substrate, means that the content is more preferably equal to or greater than 70%, still more preferably, equal to or greater than 90% and may be 100%. By using such a preferred material of the conductive substrate, the porous layer, and the above-described preferred semiconductor layer in combination, it becomes possible to achieve the semiconductor characteristics of the preferred semiconductor layer more favorably in a semiconductor element. According to the disclosure, the conductive substrate preferably contains nickel at least in a part of a surface of the substrate. The conductive substrate also preferably contains gold at least in a part of its surface.

According to the disclosure, the semiconductor element may be obtained by arranging the oxide semiconductor film including an oxide having a corundum structure as a major component directly on the conductive substrate having a larger area than the oxide semiconductor film or over the conductive substrate across a different layer. In forming the semiconductor element, what is generally done is to cut the conductive substrate having a surface to which the oxide semiconductor films arranged at regular intervals are boded directly or across a different layer into predetermined areas (while the shapes of the areas are not particularly limited, they are preferably polygonal shapes, more preferably, quadrangular shapes, most preferably, rectangular shapes) in conformity with the intervals. In some cases, however, a burr occurs at a cut surface of the conductive substrate, making it difficult to form a semiconductor element industrially available. Thus, in forming a semiconductor element, it is preferable to avoid adverse influence on semiconductor characteristics by the burr by forming the cut surface of the conductive substrate into a step height shape or making a cut from the side of the conductive substrate, not from the side of the oxide semiconductor film during the cutting. Regarding the term "different layer," it is not particularly limited but various types of films such as a crystal film, an amorphous film, and a metal film are applicable. This layer may be a conductive film or an insulating film. This layer may have a single layer structure or a structure with a plurality of layers composed of one or two or more types of the above-described films.

According to the disclosure, it is preferable that the semiconductor layer and the conductive substrate having a larger surface area than the semiconductor layer are boned to each other across a different layer that is one or more layers such as an adhesion layer (for example, an adhesion layer made of a conductive adhesive agent or metal), and the adhesion layer is sintered during the bonding to form the porous layer.

According to the disclosure, it is also possible to obtain the semiconductor element by arranging the oxide semiconductor film including an oxide having a corundum structure as a major component directly on the electrode or over the electrode across a different layer, arranging a resultant multilayer structure directly on the conductive substrate having a larger area than the oxide semiconductor film or over the conductive substrate across a different layer, and then etching a side surface of the oxide semiconductor film.

EXAMPLES

While preferred embodiments of the disclosure will be described below in more detail using the drawings, the disclosure is not limited to the following embodiments.

FIG. 1 illustrates a principal part of a Schottky barrier diode (SBD) corresponding to a semiconductor element as one preferred embodiment of the disclosure. The semiconductor element includes at least a semiconductor layer 101, and a porous layer 108 having a porosity of equal to or less than 10% and arranged on the side of a first surface of the semiconductor layer 101 or on the side of a second surface of the semiconductor layer 101 opposite the first surface side. The SBD in FIG. 1 further includes an Ohmic electrode 102, a Schottky electrode 103, and a dielectric film 104. The Ohmic electrode 102 includes a metal layer 102a, a metal layer 102b, and a metal layer 102c. The semiconductor layer 101 includes a first semiconductor layer 101a and a second semiconductor layer 101b. The Schottky electrode 103 includes a metal layer 103a, a metal layer 103b, and a metal layer 103c. The first semiconductor layer 101a is an n$^-$-type semiconductor layer, for example. The second semiconductor layer 101b is an n$^+$-type semiconductor layer 101b, for example. The dielectric film 104 (hereinafter may also be called an "insulator film") covers a side surface of the semiconductor layer 101 (a side surface of the first semiconductor layer 101a and a side surface of the second semiconductor layer 101b) and has an opening located at an upper surface of the semiconductor layer 101 (first semiconductor layer 101a). The opening is provided between a part of the first semiconductor layer 101a and the metal layer 103c of the Schottky electrode 103. The dielectric film 104 may extend in such a manner as to cover the side surface of the semiconductor layer 101 and to cover a part of the upper surface of the semiconductor layer 101 (first semiconductor layer 101a). By the presence of the dielectric film 104, the semiconductor element in FIG. 1 makes it possible to improve crystal defect at an end portion, to form a depletion layer more favorably, to relax electric field still more favorably, and to restrict a leakage current more favorably. According to the embodiment, the porous layer 108 is arranged on the Ohmic electrode 102 (metal layer 102c). The semiconductor element further includes a conductive substrate (hereinafter also called a "substrate" simply) 109 arranged on the porous layer 108. According to the embodiment, the substrate 109 has a larger area than the semiconductor layer 101. According to the embodiment, the Ohmic electrode 102 has a larger area than the semiconductor layer 101. The phrase "having a larger area" herein means that, in FIG. 1, in a plan view of the semiconductor element in a vertical direction (in a multilayer direction), the area of the substrate 109 or that of the Ohmic electrode 102 is larger than the area of the semiconductor layer 101.

As long as a constituent material of each metal layer in each of the Ohmic electrode 102 and the Schottky electrode 103 has conductive property and available as an Ohmic electrode and a Schottky electrode, it is not particularly limited but may be publicly-known metal unless it interferes with the present disclosure. Preferably, the metal is at least one type of metal selected from Group 4 to Group 11 of the periodic table, for example. Examples of metal in Group 4 of the periodic table include titanium (Ti), zirconium (Zr), and hafnium (Hf). Examples of metal in Group 5 of the periodic table include vanadium (V), niobium (Nb), and tantalum (Ta). Examples of metal in Group 6 of the periodic table include chromium (Cr), molybdenum (Mo), and tungsten (W). Examples of metal in Group 7 of the periodic table include manganese (Mn), technetium (Tc), and rhenium (Re). Examples of metal in Group 8 of the periodic table include iron (Fe), ruthenium (Ru), and osmium (Os). Examples of metal in Group 9 of the periodic table include cobalt (Co), rhodium (Rh), and iridium (Ir). Examples of metal in Group 10 of the periodic table include nickel (Ni), palladium (Pd), and platinum (Pt). Examples of metal in Group 11 of the periodic table include copper (Cu), silver (Ag), and gold (Au). While the thickness of each of the metal layers is not particularly limited, it is preferably from 0.1 nm to 10 µm, more preferably, from 5 to 500 nm, most preferably, from 10 to 200 nm.

Means of forming each metal layer in each of the Ohmic electrode 102 and the Schottky electrode 103 is not particularly limited but may be publicly-known means. Specific examples of the forming means include dry method and wet method. Examples of the dry method include sputtering, vacuum evaporation, and CVD. Examples of the wet method include screen printing and die coating.

Simulation of a heat distribution was conducted to examine heat dispersion performance of the semiconductor element illustrated in FIG. 1 and heat dispersion performance of a semiconductor element in which the substrate 109 has the same area as the semiconductor layer 101 using corresponding semiconductor devices. Evaluation result thereof is illustrated in FIG. 15. As clearly seen from FIG. 15, the semiconductor element of the disclosure has excellent heat dispersion performance and is useful for a semiconductor device requiring heat dissipation performance. Simulation of a heat distribution was further conducted to examine heat dispersion performance of the semiconductor element illustrated in FIG. 1 and heat dispersion performance of a semiconductor element in which the Ohmic electrode 102 has the same area as the semiconductor layer 101 using corresponding semiconductor devices. In this case, comparable evaluation result was obtained.

According to the disclosure, it is preferable that the semiconductor layer 101 includes at least a first side, a second side, a first crystal axis, and a second crystal axis, a linear thermal expansion coefficient in a direction of the first crystal axis is less than a linear thermal expansion coefficient in a direction of the second crystal axis, a direction of the first side is parallel or substantially parallel to the direction of the first crystal axis, a direction of the second side is parallel or substantially parallel to the direction of the second crystal axis, the substrate 109 includes at least a side corresponding to the first side and a side corresponding to the second side, and the side corresponding to the first side is longer than the side corresponding to the second side as they achieve still more excellent heat dissipation performance of the semiconductor element. Likewise, it is preferable that the Ohmic electrode 102 includes at least a side corresponding to the first side and a side corresponding to the second side and the side corresponding to the first side is longer than the side corresponding to the second side as they achieve still more excellent heat dissipation performance of the semiconductor element. Simulation of a heat distribution was conducted in a case where such a preferred semiconductor element is used in a semiconductor device and in a case where a semiconductor element in which the substrate 109 has the same area as the semiconductor layer 101 is used in a semiconductor device. Evaluation result thereof is illustrated in FIG. 16. As clearly seen from FIG. 16, the above-described semiconductor element of the disclosure has more excellent heat dispersion performance and is more useful for a semiconductor device requiring heat dissipation performance. Likewise, simulation of a heat distribution was conducted in a case where such a preferred semiconductor element is used in a semiconductor device and in a case where a semiconductor element in which the Ohmic electrode 102 has the same area as the semiconductor layer 101 is used in a semiconductor device. In this case, comparable evaluation result was obtained.

Figure 6:
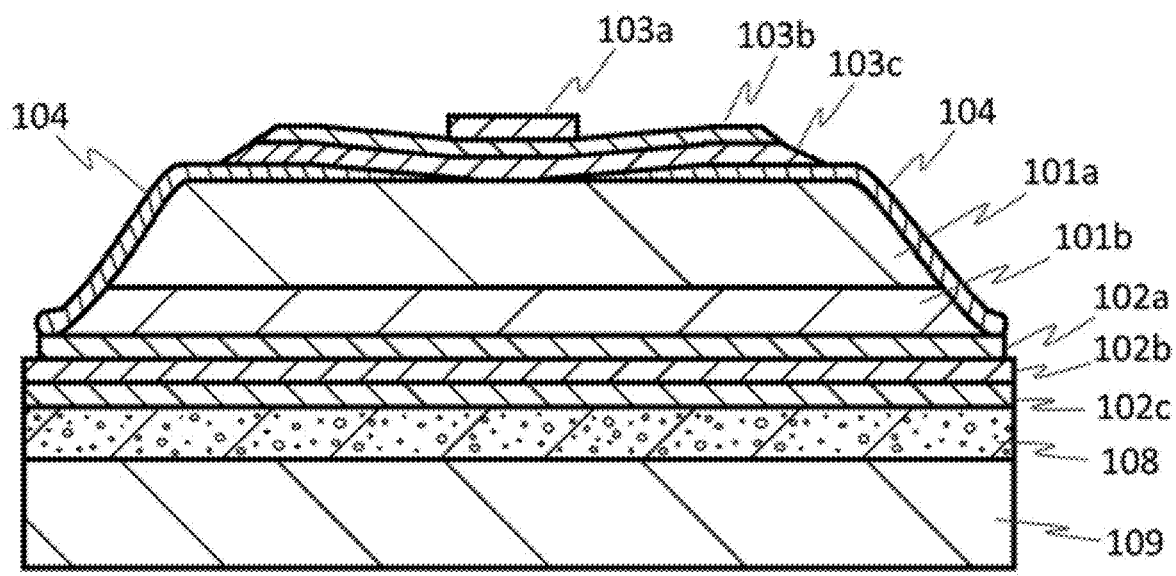
FIG. 6 is a sectional view schematically illustrating a preferred embodiment of a semiconductor element of the disclosure.

FIG. 6 illustrates a principal part of a Schottky barrier diode (SBD) corresponding to a semiconductor element as one preferred embodiment of the disclosure. The SBD in FIG. 6 differs from the SBD in FIG. 1 in that it has a tapered region on a side surface of the Schottky electrode 103. In the semiconductor element in FIG. 6, an outer end portion of the metal layer 103b as a first metal layer and an outer end portion of the metal layer 103c as the first metal layer, or the outer end portion of the metal layer 103b or the outer end portion of the metal layer 103c is located external to an outer end portion of the metal layer 103a as a second metal layer. This allows a leakage current to be restricted more favorably. Additionally, a part of the metal layer 103b and a part of the metal layer 103c, or a part of the metal layer 103b or a part of the metal layer 103c jutting out externally further than the outer end portion of the metal layer 103a has a tapered region in which a thickness is reduced toward an external side of the semiconductor element. This achieves a configuration with more excellent performance in terms of withstand voltage. According to the embodiment, the substrate 109 has a larger area than the semiconductor layer 101. According to the embodiment, the Ohmic electrode 102 has a larger area than the semiconductor layer 101. The phrase "having a larger area" herein means that, in FIG. 1, in a plan view of the semiconductor element in a vertical direction (in a multilayer direction), the area of the substrate 109 is larger than the area of the semiconductor layer 101.

A constituent material of the metal layer 103a may be the metal described above as an example of the constituent material of each of the metal layers, for example. A constituent material of each of the metal layer 103b and the metal layer 103c may be the metal described above as an example of the constituent material of each of the metal layers, for example. Means of forming each layer in FIG. 1 is not particularly limited but may be publicly-known means unless it interferes with the present disclosure. Examples of the means include means of depositing a film using vacuum evaporation method, CVD method, sputtering method, or various types of coating technique, and then performing patterning using photolithography method, and means of performing patterning directly using technique such as printing.

Figure 2:
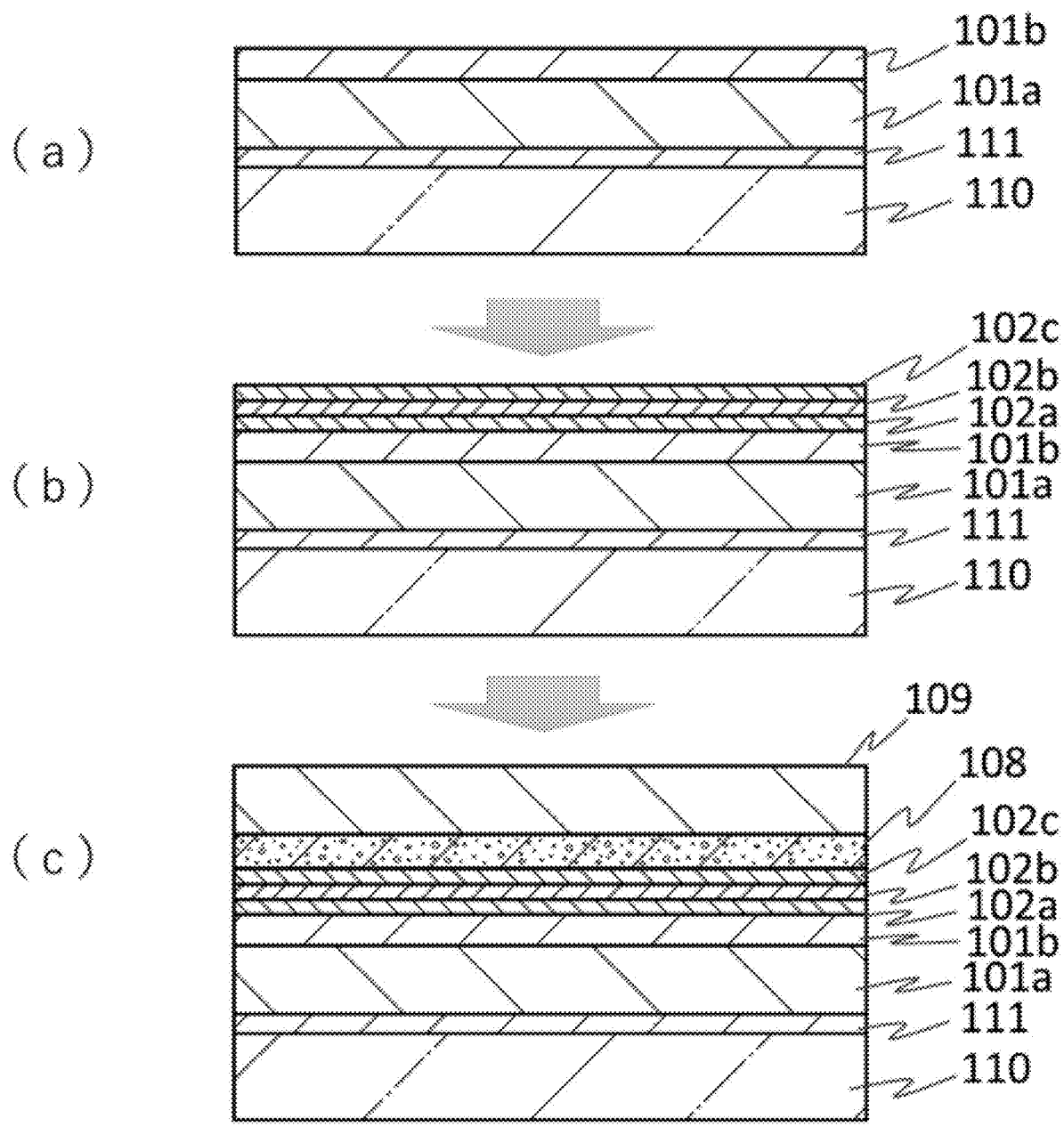
FIG. 2 is a view explaining an embodiment of a preferred method of manufacturing the semiconductor element in FIG. 1.
Figure 3:
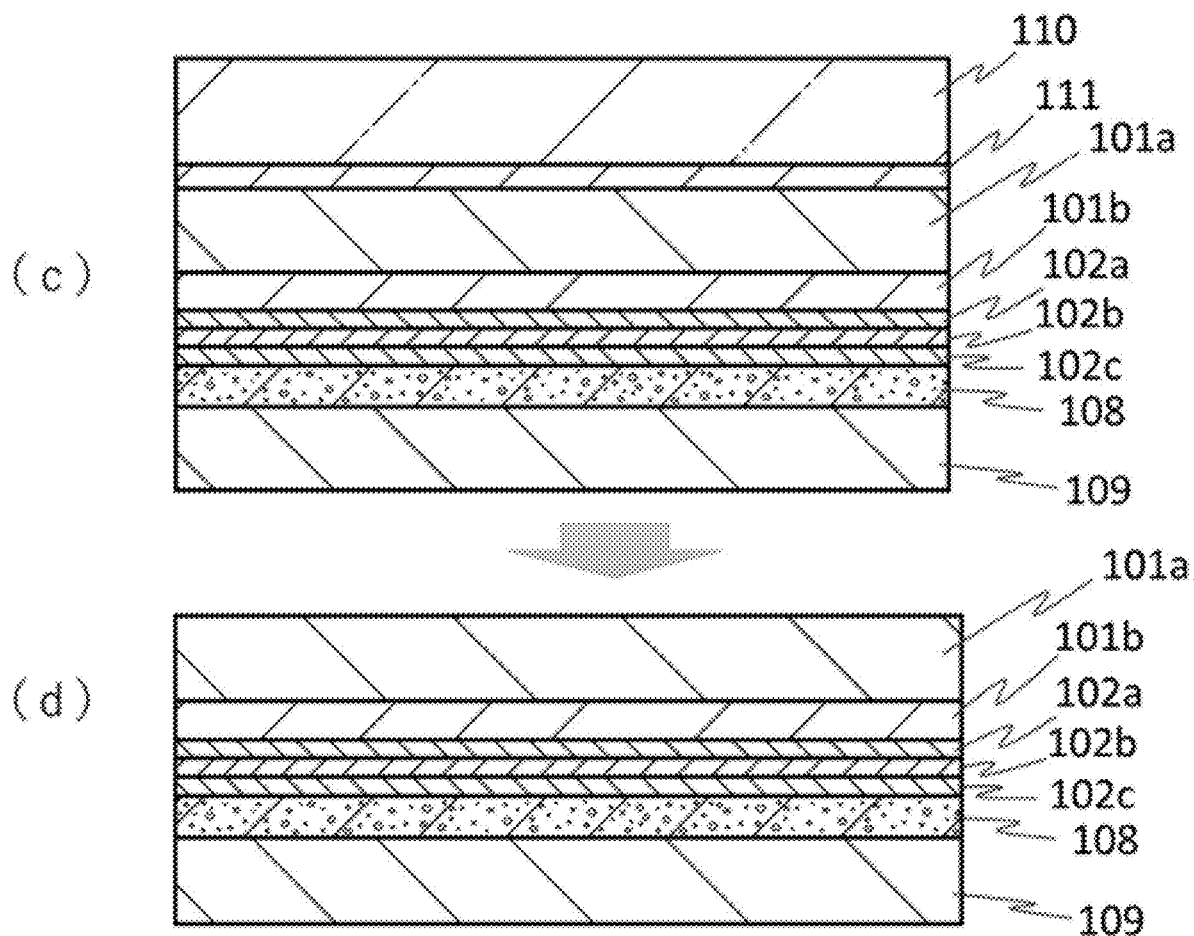
FIG. 3 is a view explaining an embodiment of a preferred method of manufacturing the semiconductor element in FIG. 1.
Figure 4:
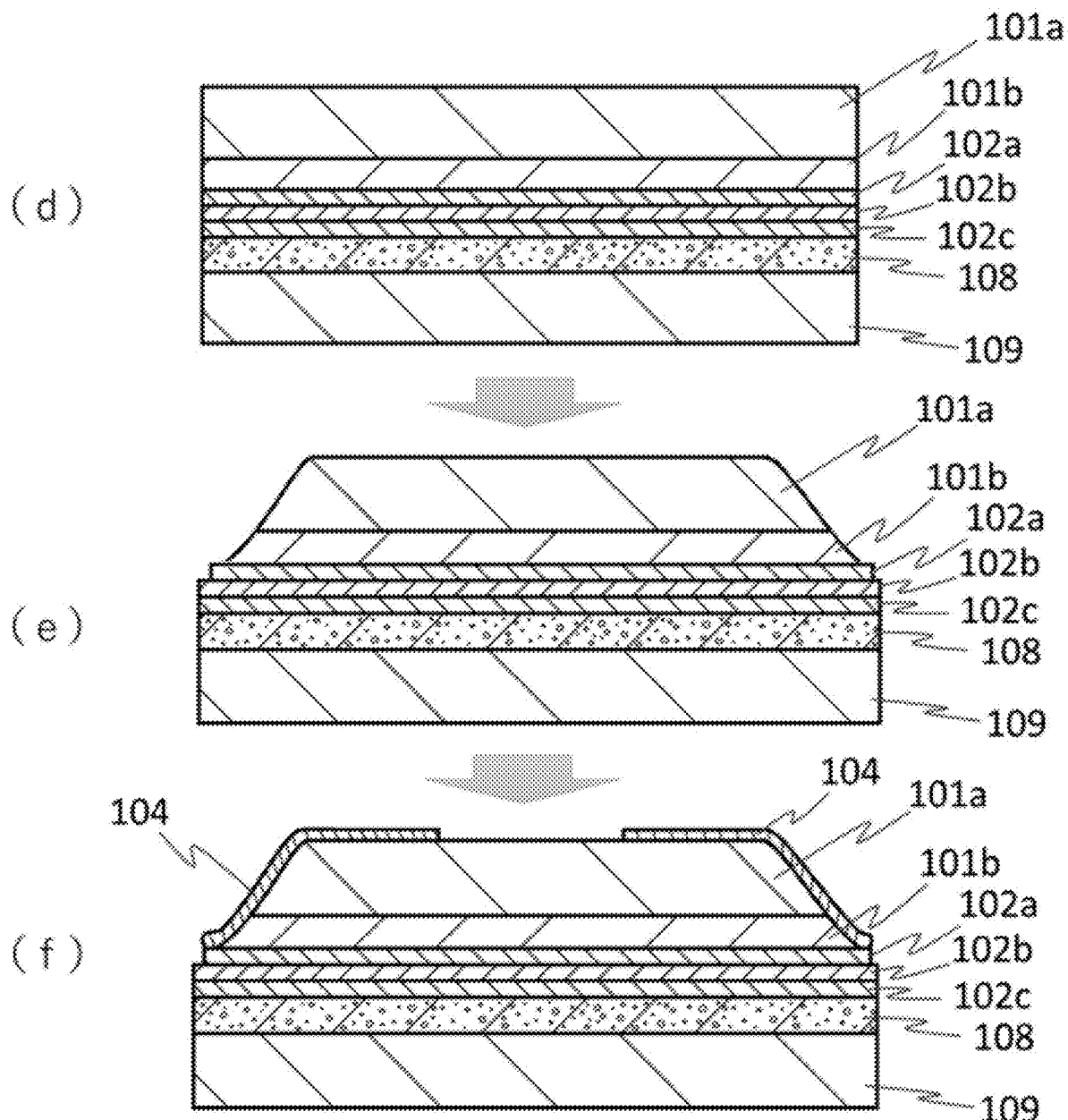
FIG. 4 is a view explaining an embodiment of a preferred method of manufacturing the semiconductor element in FIG. 1.
Figure 5:
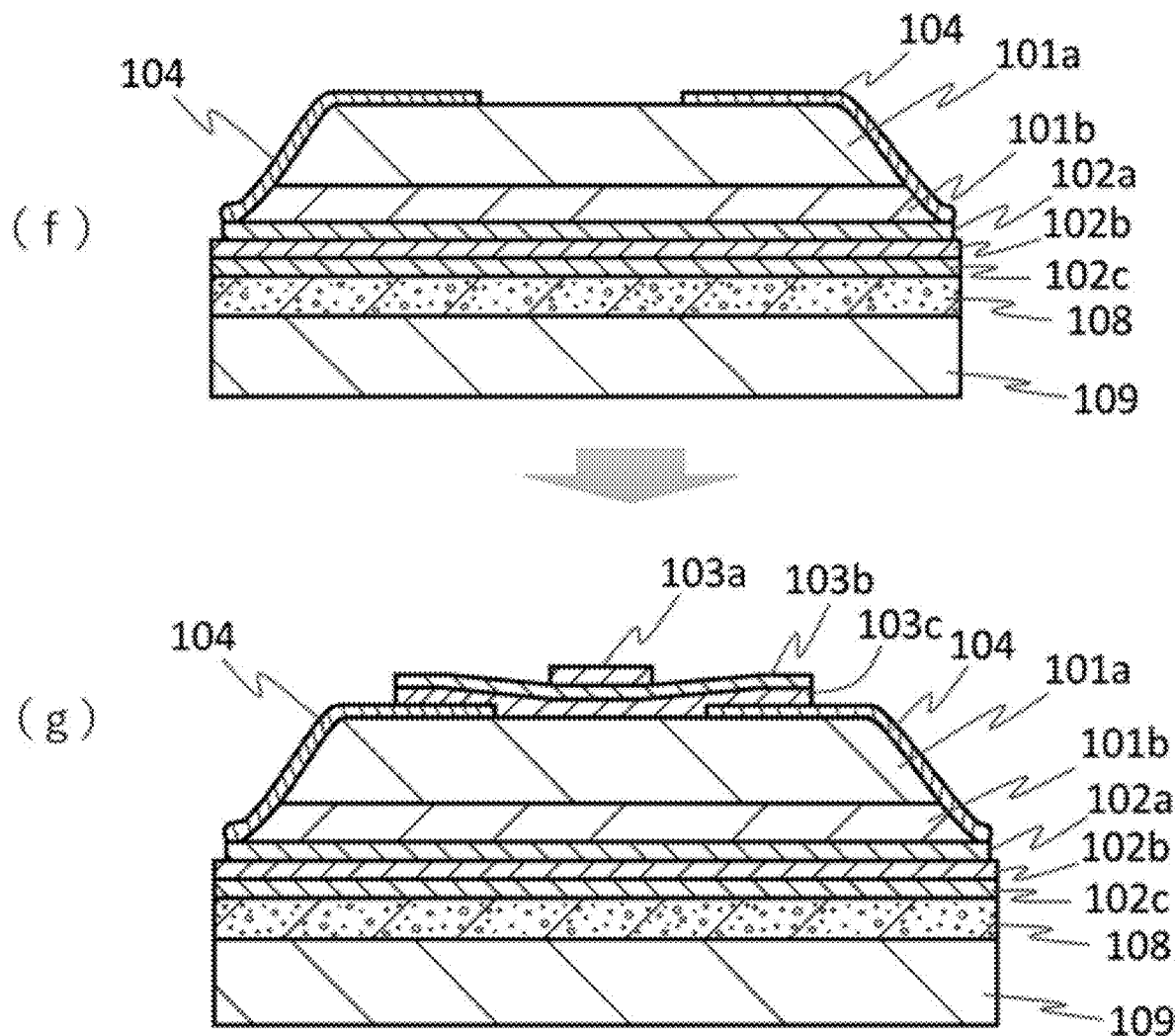
FIG. 5 is a view explaining an embodiment of a preferred method of manufacturing the semiconductor element in FIG. 1.

While preferred steps of manufacturing the SBD in FIG. 1 will be described next, the disclosure is not limited to these preferred manufacturing methods. FIG. 2(a) illustrates a multilayer structure with the first semiconductor layer 101a and the second semiconductor layer 101b arranged over a crystal growth substrate (sapphire substrate) as a base 110 across a stress relaxing layer by the above-described mist CVD method. By using the above-described dry method or wet method, the metal layer 102a, the metal layer 102b, and the metal layer 102c are formed as an ohmic electrode on the second semiconductor layer 101b, thereby obtaining a multilayer structure in FIG. 2(b). Furthermore, the substrate 109 is arranged over the multilayer structure in FIG. 2(b) across the porous layer 108 made of precious metal to obtain a multilayer structure (c). Then, as illustrated in FIG. 3, the base 110 and the stress relaxing layer 111 of the multilayer structure (c) are separated by publicly-known separation means to obtain a multilayer structure (d). Next, as illustrated in FIG. 4, a side surface of the semiconductor layer of the multilayer structure (d) is etched to be tapered to obtain a multilayer structure (e). Then, the insulator film 104 is arranged on the upper surface except the tapered side surface and the opening of the semiconductor layer to obtain a multilayer structure (0. Next, as illustrated in FIG. 5, by using the above-described dry method or wet method, the metal layers 103a, 103b, and 103c are formed as a Schottky electrode in a part corresponding to the opening at the upper surface of the semiconductor layer of the multilayer structure (0 to obtain a multilayer structure (g). In a resultant semiconductor element thereby obtained, the Ohmic electrode 102 and the substrate 109 have larger areas than the semiconductor layers 101a and 101b to achieve excellent semiconductor characteristics and excellent heat dissipation performance. Furthermore, the resultant semiconductor element thereby obtained has a configuration that allows diffusion of oxygen, etc. in the semiconductor layer to be restricted favorably, achieves excellent Ohmic characteristics, improves crystal defect at an end portion, allows a depletion layer to be formed more favorably, achieves relaxing of electric field still more favorably, and allows a leakage current to be restricted more favorably. A prototype of an SBD was formed experimentally according to the above-described preferred embodiment and was found using a microscope, for example, that the SBD is free from any particular cracks or irregularities, fulfills excellent flatness, and is free from distortion. The performance of the prototype of this example was evaluated by conducting a power cycle test. The test was completed after making 3000 cycles for 5 minutes. Favorable evaluation result was obtained and the prototype was found to have sufficient heat dissipation performance and sufficient resistance to heat. As illustrated in FIG. 7(b), a porous layer having a porosity of equal to or less than 10% is used in the item of this example.

Figure 17:
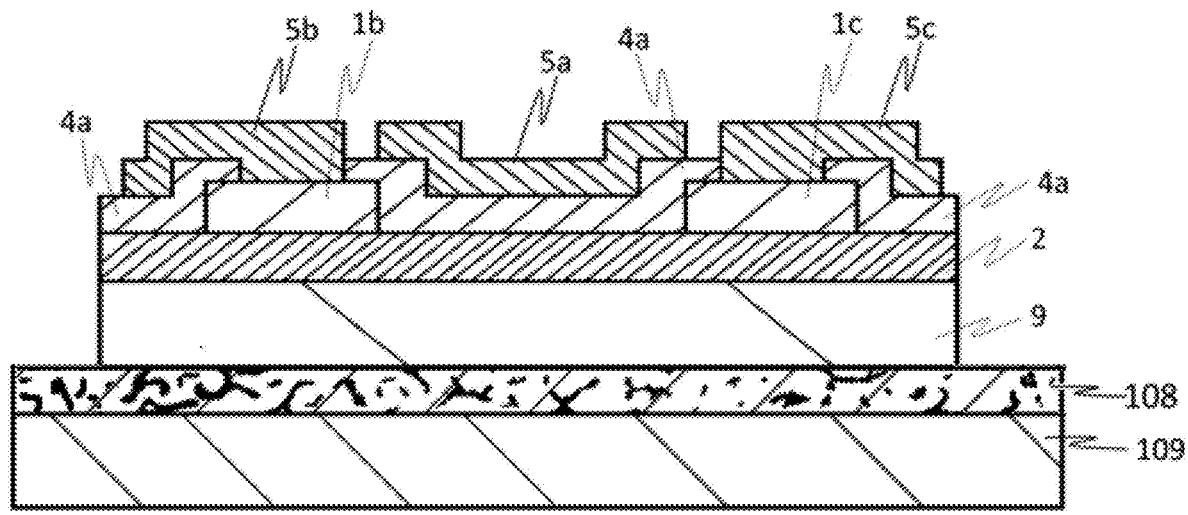
FIG. 17 is a sectional view schematically illustrating a preferred embodiment of a semiconductor element of the disclosure.

FIG. 17 illustrates an example of a case where the semiconductor element is a lateral device. An MOSFET in FIG. 17 is a lateral MOSFET including an n$^+$-type semiconductor layer (n$^+$-type source layer) 1b, an n$^+$-type semiconductor layer (n$^+$-type drain layer) 1c, a high-resistance oxide film 2 as a p-type semiconductor layer, a gate insulating film 4a, a gate electrode 5a, a source electrode 5b, a drain electrode 5c, an insulator substrate 9, a porous layer 108, and a substrate 109. According to the embodiment, the substrate 109 has a larger area than the n$^+$-type semiconductor layer (n$^+$-type source layer) 1b and the n$^+$-type semiconductor layer (n$^+$-type drain layer) 1c. In the semiconductor element in FIG. 17, the insulator substrate 9 is joined to the substrate 109 across the porous layer 108. Alternatively, according to the disclosure, the insulator substrate 9 may be joined directly to the substrate 109 or may be joined using different publicly-known means. Means of forming each layer in FIG. 17 is not particularly limited but may be publicly-known means unless it interferes with the present disclosure. Examples of the means include means of depositing a film using vacuum evaporation method, CVD method, sputtering method, or various types of coating technique, and then performing patterning using photolithography method, and means of performing patterning directly using technique such as printing.

According to the disclosure, while the semiconductor element may be a lateral device or a vertical device, it is preferably a vertical device and is particularly useful for power devices. Examples of the semiconductor element include a diode (such as PN diode, Schottky barrier diode, or junction barrier Schottky diode, for example), a transistor (such as MOSFET or MESFET, for example). Of these elements, a Schottky barrier diode (SBD), a metal oxide semiconductor field-effect transistor (MOSFET), or an insulated gate bipolar transistor (IGBT) is preferred. A Schottky barrier diode SBD) is more preferred.

Figure 11:
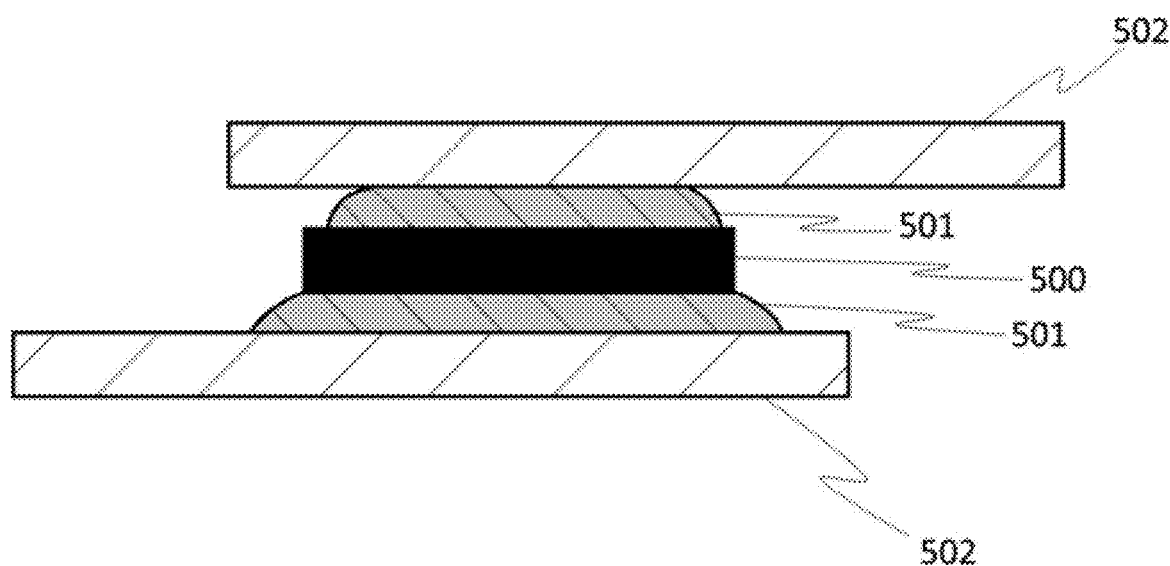
FIG. 11 is a view schematically illustrating a preferred example of a semiconductor device.
Figure 13:
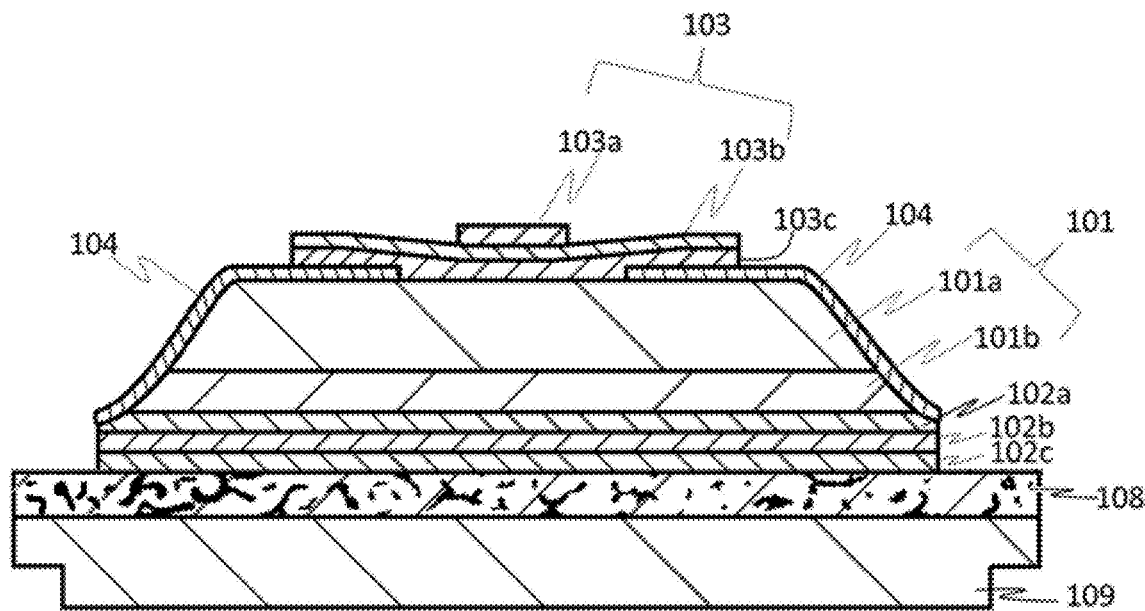
FIG. 13 is a sectional view schematically illustrating a preferred embodiment of a semiconductor element of the disclosure.
Figure 14:
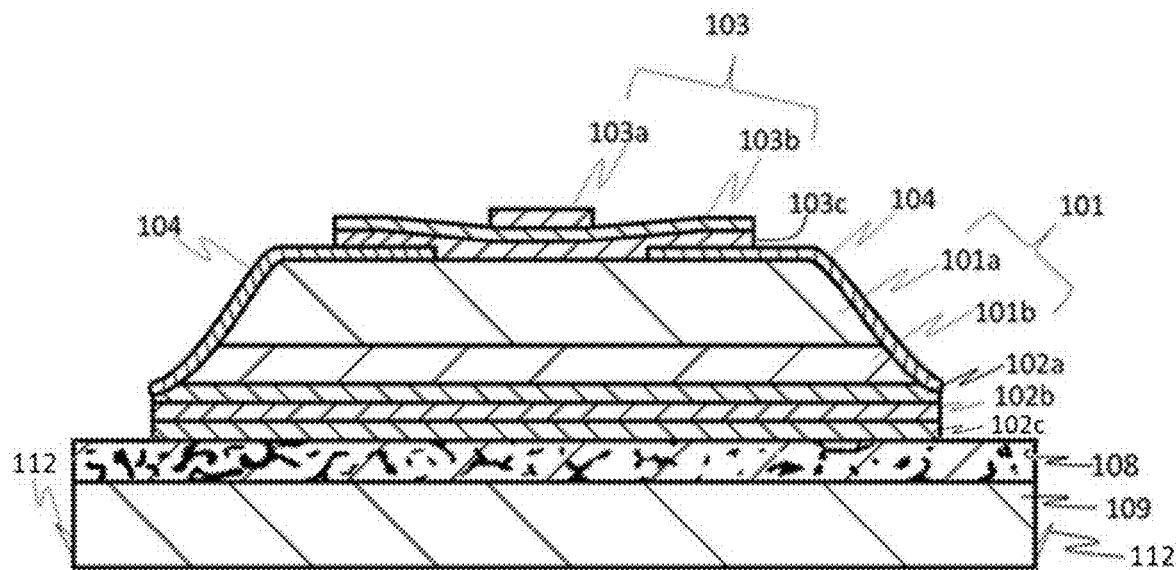
FIG. 14 is a sectional view schematically illustrating a preferred embodiment of a semiconductor element of the disclosure.

In addition to the matters described above, the semiconductor element according to the disclosure becomes preferably usable as a semiconductor device by being joined with a joint member to a lead frame, a circuit board, or a heat dissipation substrate, for example, on the basis of a common method. In particular, the semiconductor element is preferably used as a power module, an inverter, or a converter, and is further used preferably for a semiconductor system using a power source device, for example. FIG. 11 illustrates a preferred example of the semiconductor device. In the semiconductor device in FIG. 11, each of both surfaces of a semiconductor element 500 is joined with a solder 501 to a lead frame, circuit board, or heat dissipation substrate 502. Such a configuration achieves a semiconductor device with excellent heat dissipation performance. According to the disclosure, it is preferable to seal the periphery of a joint member such as a solder with resin. According to the disclosure, it is preferable that a side surface of the conductive substrate is a cut surface and the cut surface has a step or a burr as they allow formation of the semiconductor device while adverse influence on semiconductor characteristics of the semiconductor element is avoided. FIG. 13 illustrates an example of a semiconductor element in which the conductive substrate has a cut surface and the cut surface has a step. FIG. 14 illustrates an example of a semiconductor element in which the conductive substrate has a cut surface and the cut surface has a burr 112. The term "burr" herein means a residue, a nap, etc. extending from an end portion, for example, of a cutting processing surface resulting from cutting process. The step may include one or two or more step heights. The step is not particularly limited in terms of a shape, for example, unless it interferes with the present disclosure.

Figure 8:
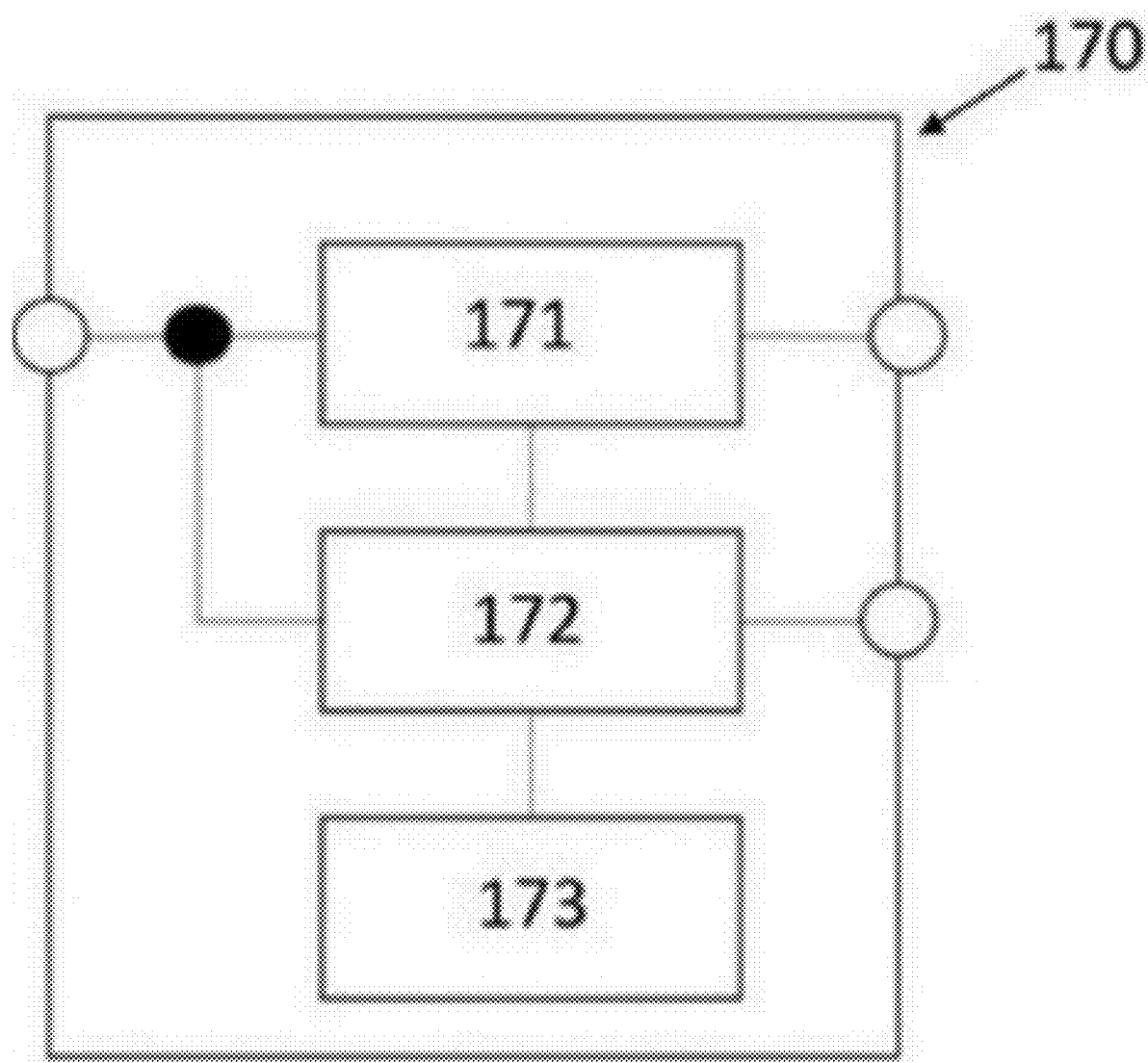
FIG. 8 is a view schematically illustrating a preferred example of a power source system.
Figure 9:
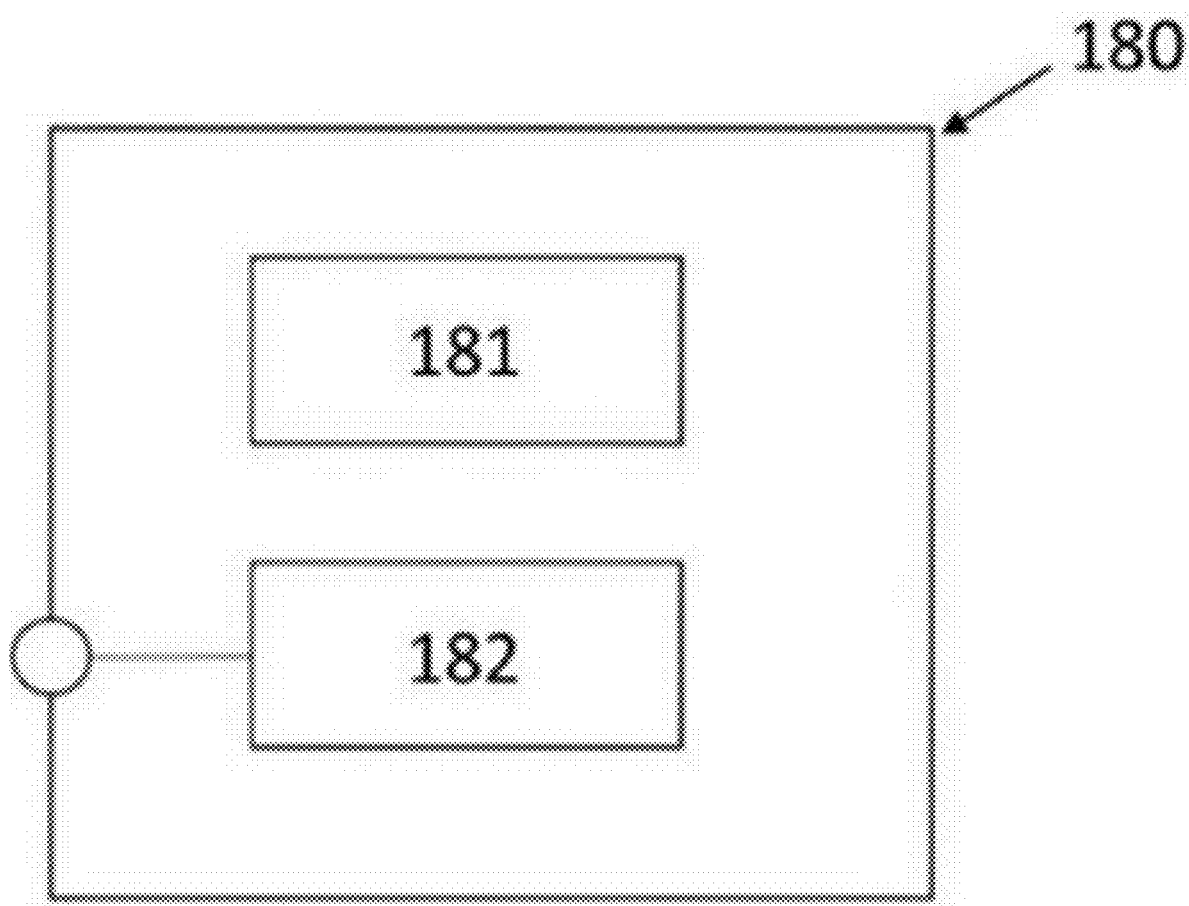
FIG. 9 is a view schematically illustrating a preferred example of a system device.
Figure 10:
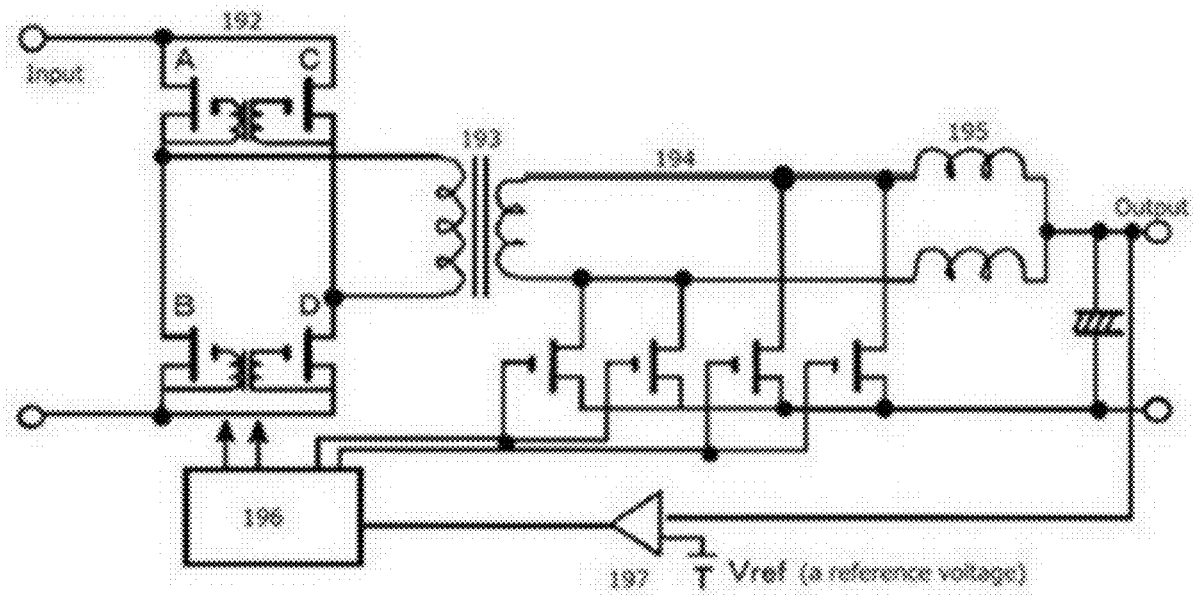
FIG. 10 is a view schematically illustrating a preferred example of a power source circuit diagram of a power source device.

The power source device may be provided from the semiconductor device or may be provided as the semiconductor device by being connected to a wiring pattern, for example, using a publicly-known method. In FIG. 8, a power source system 170 is configured using a plurality of such power source devices 171 and 172 and a control circuit 173. As illustrated in FIG. 9, the power source system is usable in a system device 180 including an electronic circuit 181 and a power source system 182 in combination. FIG. 10 illustrates an example of a power source circuit diagram of the power source device. FIG. 10 illustrates a power source circuit of a power source device including a power circuit and a control circuit. A DC voltage is switched and converted to AC at a high frequency by an inverter 192 (composed of MOSFETs A to D), and is then subjected to insulation and transformation by a transformer 193. The voltage is then rectified by a rectification MOSFET 194 and then smoothed by a DCL 195 (smoothing coils L1 and L2) and a capacitor to output a direct current voltage. At this point, the output voltage is compared with a reference voltage by a voltage comparator 197 to control the inverter 192 and the rectification MOSFET 194 using a PWM control circuit 196 so as to obtain a desired output voltage.

Figure 12:
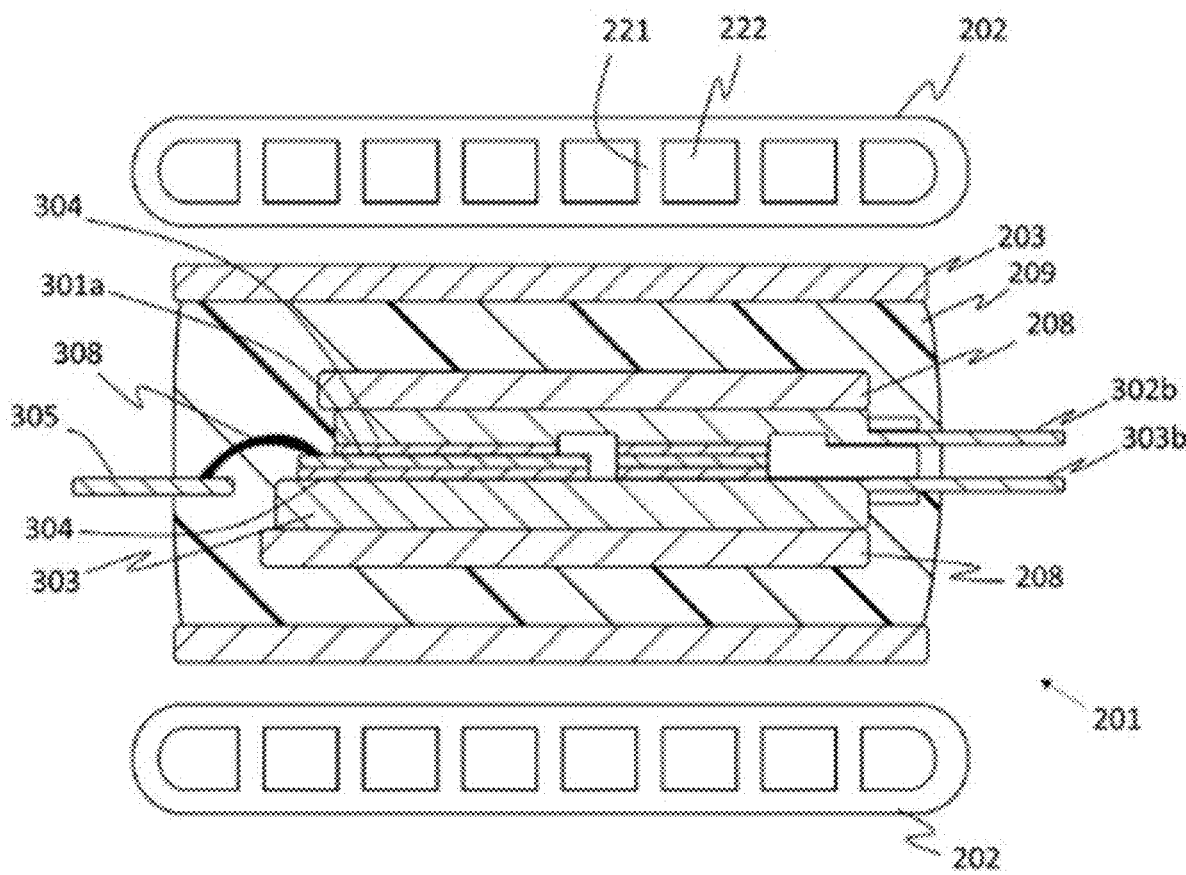
FIG. 12 is a view schematically illustrating a preferred example of a power card.

According to the disclosure, the semiconductor device is preferably a power card. More preferably, the power card includes a cooler and an insulating member and the cooler is provided on each of both sides of the semiconductor layer across at least the insulating member. Most preferably, a heat dissipation layer is provided on each of the both sides of the semiconductor layer and the cooler is provided external to the heat dissipation layer across at least the insulating member. FIG. 12 illustrates a power card as one preferred embodiment of the disclosure. The power card in FIG. 12 is a double-sided cooling power card 201 including a coolant tube 202, a spacer 203, an insulating plate (insulating spacer) 208, a resin sealing part 209, a semiconductor chip 301a, a metal heat transfer plate (projecting terminal part) 302b, a heat sink and electrode 303, a metal heat transfer plate (projecting terminal part) 303b, a solder layer 304, a control electrode terminal 305, and a bonding wire 308. The coolant tube 202 has a section in a thickness direction provided with a large number of flow paths 222 separated with a large number of partitions 221 arranged at certain intervals therebetween and extending in a flow path direction. This preferred power card achieves higher heat dissipation performance and fulfills higher reliability.

The semiconductor chip 301a is joined to an inner principal plane of the metal heat transfer plate 302b with the solder layer 304. The metal heat transfer plate (projecting terminal part) 302b is joined to the residual principal plane of the semiconductor chip 301a with the solder layer 304. By doing so, an anode electrode surface and a cathode electrode surface of a flywheel diode are connected in so-called inverse-parallel to a collector electrode surface and an emitter electrode surface of an IGBT. The metal heat transfer plates (projecting terminal parts) 302b and 303b are made of a material that is Mo or W, for example. The metal heat transfer plates (projecting terminal parts) 302b and 303b have a difference in thickness with which a difference in thickness of the semiconductor chip 301a is absorbed to define outer surfaces of the metal heat transfer plates 302b and 303b as flat surfaces.

The resin sealing part 209 is made of epoxy resin, for example, and is molded while covering side surfaces of the metal heat transfer plates 302b and 303b. The semiconductor chip 301a is molded with the resin sealing part 209. Outer principal planes, namely, heat-receiving contact surfaces of the metal heat transfer plates 302b and 303b are completely exposed. The metal heat transfer plates (projecting terminal parts) 302b and 303b project rightward from the resin sealing part 209 in FIG. 12. The control electrode terminal 305 that is a so-called lead frame terminal forms connection between a gate (control) electrode surface and the control electrode terminal 305 of the semiconductor chip 301a where an IGBT is formed, for example.

While the insulating plate 208 as an insulating spacer is composed of an aluminum nitride film, for example, it may be a different insulating film. The insulating plate 208 tightly contacts the metal heat transfer plates 302b and 303b while covering the metal heat transfer plates 302b and 303b completely. Alternatively, the insulating plate 208 may simply contact the metal heat transfer plates 302b and 303b, or a member to transfer heat favorably such as silicone grease may be applied. Various methods are applicable to form a joint therebetween. An insulating layer may be formed by ceramic spraying, for example. The insulating plate 208 may be joined onto the metal heat transfer plate or may be joined onto or formed on the coolant tube.

The coolant tube 202 is prepared by cutting a plate material formed by pultrusion molding or extrusion molding on an aluminum alloy into a required length. The section in a thickness direction of the coolant tube 202 includes the large number of flow paths 222 separated with the large number of partitions 221 arranged at certain intervals therebetween and extending in the flow path direction. The spacer 203 may be a soft metal plate such as a solder alloy, for example. The spacer 203 may also be a film (coating) formed on the contact surfaces of the metal heat transfer plates 302b and 303b by coating, for example. The soft spacer 203 has a surface that is easy to deform and is adaptable to fine irregularities or distortion of the insulating plate 208 and to fine irregularities or distortion of the coolant tube 202, thereby reducing thermal resistance. A publicly-known member to transfer heat favorably such as grease may be applied, for example, to a surface of the spacer 203. The spacer 203 is omissible.

INDUSTRIAL APPLICABILITY

The semiconductor element according to the disclosure is available in any field including semiconductors (e.g., compound semiconductor electronic devices), electronic parts, electric equipment parts, optical electrophotographic related apparatuses, industrial members, and especially useful for power devices.

The embodiments of the present invention are exemplified in all respects, and the scope of the present invention includes all modifications within the meaning and scope equivalent to the scope of claims.

REFERENCE SIGNS LIST

1 $N^+$-type semiconductor layer
1b $N^+$-type semiconductor layer ($n^+$-type source layer)
1c $N^+$-type semiconductor layer ($n^+$-type drain layer)
2 High-resistance oxide film
4a Gate insulating film
5a Gate electrode
5b Source electrode
5c Drain electrode
9 Substrate
101 Semiconductor layer
101a First semiconductor layer
101b Second semiconductor layer
102 Ohmic electrode
102a Metal layer
102b Metal layer
102c Metal layer
103 Schottky electrode
103a Metal layer
103b Metal layer
103c Metal layer
104 Insulator film
108 Porous film
109 Substrate
110 Base
111 Stress relaxing layer
112 Burr
170 Power source system
171 Power source device
172 Power source device
173 Control circuit
180 System device
181 Electronic circuit
182 Power source system
192 Inverter
193 Transformer
194 Rectification MOSFET
195 DCL
196 PWM control circuit
197 Voltage comparator
201 Double-sided cooling power card
202 Coolant tube
203 Spacer
208 Insulating plate (insulating spacer)
209 Resin sealing part
221 Partition
222 Flow path
301a Semiconductor chip
302b Metal heat transfer plate (projecting terminal part)
303 Heat sink and electrode
303b Metal heat transfer plate (projecting terminal part)
304 Solder layer
305 Control electrode terminal
308 Bonding wire
500 Semiconductor element
501 Solder
502 Lead frame, circuit board, or heat dissipation substrate

What is claimed is:
1. A semiconductor element comprising:
a multilayer structure including: a conductive substrate; and an oxide semiconductor film arranged directly on the conductive substrate or over the conductive sub- strate via a different layer, the oxide semiconductor film including an oxide, as a major component, having a corundum structure, wherein the conductive substrate has a larger area than the oxide semiconductor film, and the conductive substrate has an area that is 1.1 to 4 times an area of the oxide semiconductor film.

2. The semiconductor element according to claim 1, wherein the oxide contains at least gallium.

3. The semiconductor element according to claim 1, wherein the oxide is $\alpha$-$Ga_2O_3$ or a mixed crystal of $\alpha$-Ga2O3.

4. The semiconductor element according to claim 1, wherein the conductive substrate has a linear thermal expansion coefficient that is equal to or less than a linear thermal expansion coefficient of the oxide semiconductor film.

5. The semiconductor element according to claim 1, wherein the oxide semiconductor film includes at least a first side, a second side, a first crystal axis, and a second crystal axis, a linear thermal expansion coefficient in a direction of the first crystal axis is less than a linear thermal expansion coefficient in a direction of the second crystal axis, a direction of the first side is parallel or substantially parallel to the direction of the first crystal axis, a direction of the second side is parallel or substantially parallel to the direction of the second crystal axis, the conductive substrate includes at least a side corresponding to the first side and a side corresponding to the second side, and the side corresponding to the first side is longer than the side corresponding to the second side.

6. The semiconductor element according to claim 1, wherein the conductive substrate is a metal substrate or a semiconductor substrate.

7. The semiconductor element according to claim 1, wherein the conductive substrate has a side surface as a cut surface and the cut surface has a step or a burr.

8. The semiconductor element according to claim 1, wherein the semiconductor element is a vertical device.

9. The semiconductor element according to claim 1, wherein the semiconductor element is a power device.

10. The semiconductor element according to claim 1, wherein the semiconductor element is a Schottky barrier diode (SBD), a metal oxide semiconductor field-effect transistor (MOSFET), or an insulated gate bipolar transistor (IGBT).

11. A semiconductor device configured by joining at least a semiconductor element with a joint member to a lead frame, a circuit board, or a heat dissipation substrate, the semiconductor element being the semiconductor element according to claim 1.

12. The semiconductor device according to claim 11, wherein the semiconductor device is a power module, an inverter, or a converter.

13. The semiconductor device according to claim 11, wherein the semiconductor device is a power card.

14. A semiconductor system comprising a semiconductor element, the semiconductor element being the semiconductor element according to claim 1.

15. A semiconductor element comprising:

a multilayer structure including: an electrode; and an oxide semiconductor film arranged directly on the electrode or over the electrode via a different layer, the oxide semiconductor film including an oxide, as a major component, having a corundum structure, wherein the electrode has a larger area than the oxide semiconductor film, and the electrode has an area that is 1.1 to 4 times an area of the oxide semiconductor film.

* * * * *